United States Patent
Oka et al.

(10) Patent No.: US 10,699,933 B2
(45) Date of Patent: Jun. 30, 2020

(54) WAFER-FIXING TAPE, METHOD OF PROCESSING A SEMICONDUCTOR WAFER, AND SEMICONDUCTOR CHIP

(71) Applicant: FURUKAWA ELECTRIC CO., LTD., Tokyo (JP)

(72) Inventors: Yoshifumi Oka, Tokyo (JP); Masami Aoyama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/702,455

(22) Filed: Sep. 12, 2017

(65) Prior Publication Data
US 2018/0012788 A1 Jan. 11, 2018

Related U.S. Application Data

(63) Continuation of application No. PCT/JP2016/057614, filed on Mar. 10, 2016.

(30) Foreign Application Priority Data

Mar. 13, 2015 (JP) ................................ 2015-051481

(51) Int. Cl.
*H01L 21/68* (2006.01)
*H01L 21/78* (2006.01)
(Continued)

(52) U.S. Cl.
CPC ............ *H01L 21/6836* (2013.01); *C09J 7/22* (2018.01); *H01L 21/3065* (2013.01);
(Continued)

(58) Field of Classification Search
CPC . H01L 21/30; H01L 21/6836; H01L 21/31138
(Continued)

(56) References Cited

U.S. PATENT DOCUMENTS 5,126,178 A * 6/1992 Takemura ................ C09J 7/201
428/40.6
6,686,225 B2 * 2/2004 Wachtler ............... H01L 21/568
257/E21.599
(Continued)

FOREIGN PATENT DOCUMENTS

JP 2002-373871 A 12/2002
JP 2006-295067 A 10/2006
(Continued)

OTHER PUBLICATIONS

English Translation of FOR patent: WO2014/200071.*
(Continued)

*Primary Examiner* — Sheikh Maruf
(74) *Attorney, Agent, or Firm* — Birch, Stewart, Kolasch & Birch, LLP

(57) ABSTRACT

A wafer-fixing tape, having: an temporary-adhesive layer provided on a substrate film, wherein the substrate film contains an ionomer resin comprising a terpolymer cross-linked by a metal ion, and wherein an arithmetic average roughness Ra of a surface of the substrate film opposite to the temporary-adhesive layer 5b is from 0.1 to 3.0 μm; a processing method of a semiconductor wafer; and a semiconductor chip.

1 Claim, 12 Drawing Sheets

(51) Int. Cl.
*H01L 21/683* (2006.01)
*C09J 7/22* (2018.01)
*H01L 21/3065* (2006.01)
*H01L 21/311* (2006.01)

(52) U.S. Cl.
CPC .......... *H01L 21/6831* (2013.01); *H01L 21/78* (2013.01); *C09J 2201/602* (2013.01); *C09J 2201/622* (2013.01); *C09J 2203/326* (2013.01); *C09J 2205/114* (2013.01); *C09J 2205/302* (2013.01); *C09J 2423/046* (2013.01); *C09J 2433/006* (2013.01); *H01L 21/31138* (2013.01); *H01L 2221/6834* (2013.01); *H01L 2221/68327* (2013.01)

(58) Field of Classification Search
USPC .................................. 438/464; 257/620, 737
See application file for complete search history.

(56) References Cited

U.S. PATENT DOCUMENTS

| | | | | |
|---|---|---|---|---|
| 2003/0129809 A1* | 7/2003 | Takyu | ...................... | H01L 21/78 438/460 |
| 2004/0102025 A1* | 5/2004 | Arita | .................. | H01J 37/32082 438/460 |
| 2006/0144515 A1* | 7/2006 | Tada | .......................... | C09J 5/00 156/706 |
| 2008/0063871 A1* | 3/2008 | Jung | ...................... | C09J 163/00 428/414 |
| 2008/0145668 A1* | 6/2008 | Jung | .................... | C09D 167/02 428/413 |
| 2009/0023295 A1* | 1/2009 | Arita | ................... | H01L 21/3065 438/710 |
| 2009/0278236 A1* | 11/2009 | Sato | .................... | H01L 21/6836 257/620 |
| 2010/0048001 A1* | 2/2010 | Harikai | ............. | H01J 37/32743 438/464 |
| 2010/0120227 A1* | 5/2010 | Grivna | .................... | H01L 21/78 438/462 |
| 2010/0178501 A1* | 7/2010 | Masuko | ...................... | C09J 4/06 428/355 N |
| 2010/0239858 A1* | 9/2010 | Masuko | .................. | C08G 18/10 428/354 |
| 2011/0159238 A1* | 6/2011 | Kawamori | .......... | C08G 73/1042 428/141 |
| 2011/0187009 A1* | 8/2011 | Masuko | ............. | C08G 73/1042 257/798 |
| 2012/0187542 A1* | 7/2012 | Kurosawa | ............... | H01L 21/78 257/618 |
| 2012/0248632 A1* | 10/2012 | Mitsukura | ............... | H01L 24/27 257/787 |
| 2012/0256326 A1* | 10/2012 | Mitsukura | ........... | H01L 21/6836 257/798 |
| 2012/0309170 A1* | 12/2012 | Hayashishita | ...... | H01L 21/6836 438/464 |
| 2014/0127880 A1* | 5/2014 | Grivna | .................... | H01L 21/78 438/458 |
| 2016/0053137 A1* | 2/2016 | Hayashishita | ...... | H01L 21/6836 438/464 |
| 2017/0198182 A1* | 7/2017 | Kim | ...................... | C09D 163/00 |
| 2017/0263524 A1* | 9/2017 | Mizuno | ............... | H01L 21/6836 |

FOREIGN PATENT DOCUMENTS

| | | |
|---|---|---|
| JP | 2007-5436 A | 1/2007 |
| JP | 2007-19385 A | 1/2007 |
| JP | 2008-193034 A | 8/2008 |
| JP | 2011-204932 A | 10/2011 |
| JP | 2011-233718 A | 11/2011 |
| JP | 2012-33889 A | 2/2012 |
| JP | 2012-89732 A | 5/2012 |
| JP | 2013-38408 A | 2/2013 |
| JP | 2014-157964 A | 8/2014 |
| WO | WO 2008/096542 A1 | 8/2008 |
| WO | WO 2014/200071 A1 | 12/2014 |
| WO | WO 2014200071 A1 * | 12/2014 ........... C08G 18/672 |

OTHER PUBLICATIONS

English Traslation of JP-2002373871A (Year: 2002).*
International Search Report for PCT/JP2016/057614 (PCT/ISA/210) dated Jun. 7, 2016.
Written Opinion of the International Searching Authority for PCT/JP2016/057614 (PCT/ISA/237) dated Jun. 7, 2016.
Korean Office Action for corresponding Korean Application No. 10-2017-7018634, dated May 15, 2018, with an English translation.
Japanese Office Action for Appl. No. 2015-051481 dated Sep. 11, 2018 (w/ English translation).

* cited by examiner

WAFER-FIXING TAPE, METHOD OF PROCESSING A SEMICONDUCTOR WAFER, AND SEMICONDUCTOR CHIP

CROSS-REFERENCE TO RELATED APPLICATIONS

This application is a Continuation of PCT International Application No. PCT/JP2016/057614 filed on Mar. 10, 2016, which claims priority under 35 U.S.C. § 119 (a) to Japanese Patent Application No. 2015-051481 filed in Japan on Mar. 13, 2015. Each of the above applications is hereby expressly incorporated by reference, in its entirety, into the present application.

TECHNICAL FIELD

The present invention relates to a processing method of: singulating a semiconductor wafer into chips, and in particular, it relates to a semiconductor-wafer processing method using plasma dicing; a wafer-fixing tape that can be used in the plasma dicing; and semiconductor chips obtained by the processing method.

BACKGROUND ART

In recent years, with the development of mobile devices, further thinning of the semiconductor device has been desired. For this reason, it is required to reduce the thickness of the semiconductor chip to a range of 50 to 100 µm, or less. Generally, when backing-face grinding is carried out, a surface protective tape is laminated on a patterned face of the semiconductor wafer on which a circuit or the like is provided, whereby protection of the patterned face and fixation of the wafer are practiced, and then the backing-face grinding is carried out. After that, through various kinds of steps, such as dicing, picking-up, die-bonding, and resin sealing, a semiconductor device is produced.

When the semiconductor wafer is subjected to dicing, and is singulated into chips, singulation (dicing) of the wafer is carried out, by laminating a dicing tape on a backing face side (grinding side) of the semiconductor wafer, and thereby securing the wafer on the dicing tape. Accordingly, it is required that, when a wafer is subjected to dicing, the wafer is fixed with a sufficient adhesion force, and on the other hand, at the end of the dicing, the singulated chips are picked up from the dicing tape.

In dicing of the semiconductor wafer, cracks or cracking of the chips which are called chipping, occur, and the size thereof sometimes reaches 100 µm. In the advanced semiconductor device in terms of thinning thereof, even the chipping with several ten µm size, the chipping sometimes arrives at the patterned face, which results in reduction of the yield.

Such chipping is attributed to a fact that chips are vibrated by a rotary blade for cutting a wafer at the dicing, so that the chip and the rotary blade, or the chips are brought into contact with each other. In order to solve the problem of the chipping, Patent Literature 1 discloses a temporary-adhesive composition for more rigidly securing chips. However, a sufficient suppression of the chipping has not yet been achieved.

In recent years, various kinds of methods have been used in place of a dicing method using a rotary blade. In particular, plasma dicing has been perceived to be one of the most suitable steps of dividing into chips on the ground that vibration toward chips is not only suppressed, but also an etching speed is very high, and so on. Regarding the plasma dicing, for example, there is described in Patent Literature 2.

CITATION LIST

Patent Literatures

Patent Literature 1: JP-A-2011-233718 ("JP-A" means unexamined published Japanese patent application)
Patent Literature 2: JP-A-2007-019385

SUMMARY OF INVENTION

Technical Problem

The picking-up step is carried out under such condition that a dicing tape has been stretched. Specifically, semiconductor chips to be picked up are knocked up with a pin from the bottom of the dicing tape, and the semiconductor chips are picked up from the top by vacuum adsorption with a collet or the like. At the time of the up-thrust with a pin, a dicing tape is stretched, whereby chip intervals are expand, and therefore the stretchable dicing tape is needed to provide an expansion property. On the other hand, the dicing tape is needed to provide a heat resistance, because the plasma dicing step is subjected to a high temperature. In the conventional dicing tape, a balance between these properties was difficult. Specifically, a tape exhibiting a good expansion property was apt to melt with a heat at the time of the plasma dicing, whereas a tape exhibiting a good heat resistance was apt to be unable to expand. For this reason, a development of the dicing tape having ensured compatibility between the expansion property and the heat resistance has been required.

In view of the above problems, the present invention has been made. In the processing of the semiconductor wafer using the plasma dicing, the present invention is contemplated for providing a wafer-fixing tape, which is excellent in the heat resistance when the plasma dicing is carried out, and which is excellent in the expansion property when the picking-up is carried out.

Further, in a processing method of the semiconductor wafer using this wafer-fixing tape, the present invention is contemplated for providing a processing method of the semiconductor wafer, which suppresses occurrence of the chipping, and which is excellent in picking-up property, and the present invention is contemplated for providing semiconductor chips produced through the foregoing processing method of the semiconductor wafer.

Solution to Problem

The problems of the present invention are solved by the following means:
[1] A wafer-fixing tape, comprising: a temporary-adhesive layer provided on a substrate film, wherein the substrate film contains an ionomer resin comprising a terpolymer cross-linked by a metal ion, and wherein an arithmetic average roughness Ra of a surface of the substrate film opposite to the temporary-adhesive layer is from 0.1 to 3.0 µm.
[2] The wafer-fixing tape described in the item [1], wherein the thermal conductivity is from 0.2 W/m·K to 5.0 W/m·K.
[3] The wafer-fixing tape described in the item [1] or [2], wherein a change of the adhesion force to silicon after heating at 100° C. for 10 minutes is 0.3 N/25-mm or less.
[4] The wafer-fixing tape described in any of the items [1] to [3], wherein the wafer-fixing tape is a plasma dicing tape capable of carrying out a plasma dicing step by laminating the wafer-fixing tape onto a semiconductor wafer.

[5] A processing method of a semiconductor wafer, comprising: (a) a plasma dicing step of laminating the wafer-fixing tape described in any of the items [1] to [4] onto a patterned face of the semiconductor wafer, and stacking a resist on a backing face of the semiconductor wafer, and dividing the semiconductor wafer by a $SF_6$ plasma from the backing face side, thereby for singulating into semiconductor chips; and (d) an ashing step of removing the resist by an $O_2$ plasma.

[6] The processing method of a semiconductor wafer described in the item [5], further comprising a step of having crosslink the temporary-adhesive layer by irradiating an ultraviolet ray from the wafer-fixing tape side.

[7] A processing method of a semiconductor wafer, comprising: (a) a plasma dicing step of stacking a resist on a patterned face of the semiconductor wafer, laminating the wafer-fixing tape described in any of the items [1] to [4] onto a backing face of the semiconductor wafer, and dividing the semiconductor wafer by a $SF_6$ plasma from the patterned face side, thereby for singulating into semiconductor chips; and (d) an ashing step of removing the resist by an $O_2$ plasma.

[8] The processing method of a semiconductor wafer described in the item [7], further comprising a step of transferring the singulated semiconductor chips from the wafer-fixing tape to a picking-up tape.

[9] The processing method of a semiconductor wafer described in any of the items [5] to [8], further comprising a step of grinding the backing face of the semiconductor wafer in a state of having laminated the surface protective tape on the patterned face of the semiconductor wafer.

[10] The processing method of a semiconductor wafer described in any of the items [5] to [9], further comprising a step of supporting and fixing the wafer-fixing tape with a ring frame, and a step of picking up the chips from the wafer-fixing tape.

[11] A semiconductor chip, produced by the processing method of a semiconductor wafer described in any of the items [5] to [10].

Advantageous Effects of Invention

According to the present invention, it is able to achieve: heat resistance at the time of plasma dicing; and a good picking-up property, and further, it is able to reduce occurrence of the chipping, whereby a yield can be improved.

Other and further features and advantages of the invention will appear more fully from the following description, appropriately referring to the accompanying drawings.

BRIEF DESCRIPTION OF DRAWINGS

FIG. 1(a) shows a semiconductor wafer. Fragmentary FIG. 1(b) shows how the surface protective tape is laminated. Fragmentary FIG. 1(c) shows a semiconductor wafer on which the surface protective tape is laminated.

FIG. 2(a) shows a thinning processing of the semiconductor wafer. Fragmentary FIG. 2(b) shows how a surface protective tape is peeled off. Fragmentary FIG. 2(c) shows a state in which a mask is formed on the patterned face. Fragmentary FIG. 2(d) shows a layer constitution of the wafer-fixing tape.

FIG. 3(a) shows a state in which a wafer-fixing tape is laminated. Fragmentary FIG. 3(b) shows how plasma dicing is carried out. Fragmentary FIG. 3(c) shows a state of singulation into chips.

FIG. 4(a) shows how plasma ashing is carried out. Fragmentary FIG. 4(b) shows a state in which a resist acted as a mask is removed. Fragmentary FIG. 4(c) shows how the chip is picked up.

FIG. 5(a) shows a semiconductor wafer. Fragmentary FIG. 5(b) shows a state in which a patterned face is masked with a resist. Fragmentary FIG. 5(c) shows how the surface protective tape is laminated.

FIG. 6(a) shows a state in which a surface protective tape is laminated onto a masked patterned face. Fragmentary FIG. 6(b) shows a thinning processing of the semiconductor wafer. Fragmentary FIG. 6(c) shows how the surface protective tape is peeled off.

FIG. 7(a) shows singulated semiconductor chips on a wafer-fixing tape. Fragmentary FIG. 7(b) shows a step of transferring each chip to a picking-up tape. Fragmentary FIG. 7(c) shows how the chip is picked up from the picking-up tape.

FIG. 8(a) shows a state in which a patterned face is coated with a resist. Fragmentary FIG. 8(b) shows how an ultraviolet ray is irradiated from the semiconductor wafer-fixing tape side. Fragmentary FIG. 8(c) shows how plasma dicing is carried out.

FIG. 9(a) shows a state in which a patterned face is coated with a surface protective tape, and a mask with a resist is formed on the ground backing face. Fragmentary FIG. 9(b) shows how the surface protective tape is peeled off. Fragmentary FIG. 9(c) shows how the wafer-fixing tape is laminated onto the patterned face.

FIG. 10(a) shows how the plasma dicing is carried out from the backing face of the wafer. Fragmentary FIG. 10(b) shows a state of singulation into chips. Fragmentary FIG. 10(c) shows how the plasma ashing is carried out.

FIG. 11(a) shows a state in which a resist acted as a mask is removed. Fragmentary FIG. 11(b) shows how a chip is picked up.

FIG. 12(a) shows a state in which a patterned face is coated with a wafer-fixing tape. Fragmentary FIG. 12(b) shows how the ultraviolet ray is irradiated from the wafer-fixing tape side. Fragmentary FIG. 12(c) shows how plasma dicing is carried out.

DESCRIPTION OF EMBODIMENTS

Figure 1A:
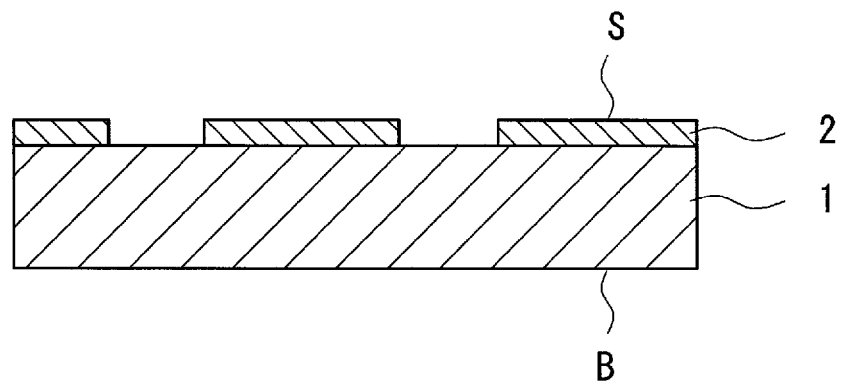
FIGS. 1(a) to (c) are schematic cross-sectional views illustrating steps until a surface protective tape is laminated onto a semiconductor wafer in a first embodiment of the present invention. Fragmentary
Figure 1B:
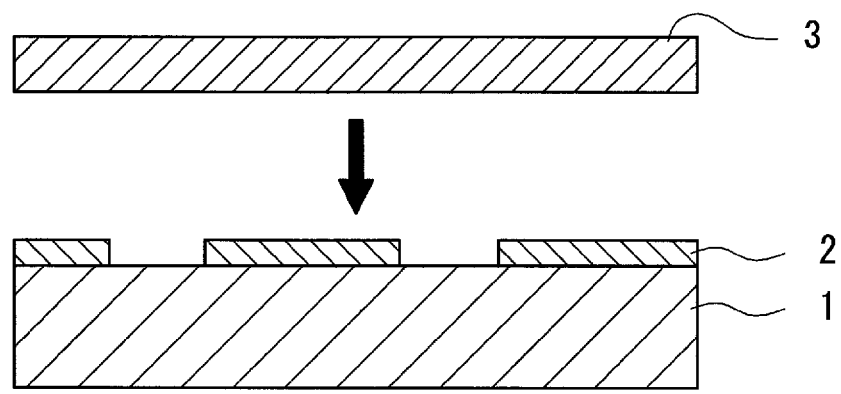
Figure 1C:
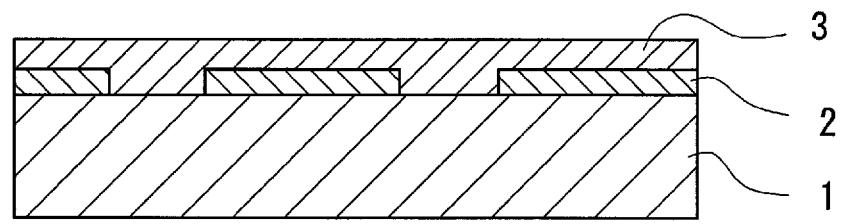

Hereinafter, preferable embodiments of the wafer-fixing tape of the present invention and the processing method of the semiconductor wafer according to the present invention are described with reference to drawings. However, the present invention is not limited to these embodiments.

Note that, as for the apparatus and materials, each of which can be used in the steps described below, use can be made of an apparatus and the like which has been used for processing of the semiconductor wafer from the past, unless otherwise specified, and as for the use conditions thereof, suitable conditions in an ordinary manner can be set. Further, omitted are duplicated descriptions about the materials, structures, methods, effects, and the like, which are common to each embodiment.

<<Wafer-Fixing Tape>>

A wafer-fixing tape 5 of the present invention is a wafer-fixing tape suitable for use in a processing method of the semiconductor wafer, by masking a device face or a backing face of the semiconductor wafer in a photolithographic step; and then, by subjecting the resultant mask to plasma dicing and plasma ashing.

The wafer-fixing tape 5 of the present invention has a temporary-adhesive layer 5b provided on a substrate film 5a, and the substrate film 5a contains an ionomer resin comprising a terpolymer crosslinked by a metal ion, with being an arithmetic average roughness Ra of a surface of the substrate film opposite to the temporary-adhesive layer from 0.1 to 3.0 μm.

<Substrate Film>

The terpolymer which constitutes the ionomer resin that can be used in the present invention includes other copolymer component, such as α,β-unsaturated carboxylic acid esters and (meth)acrylic acid esters, in addition to ethylene and (meth)acrylic acid. As the other copolymer component, (meth)acrylic acid esters are preferred, (meth)acrylic acid alkyl esters are more preferred, and (meth)acrylic acid branched alkyl esters are still more preferred. In this regard, the carbon number of alcohol moieties in the (meth)acrylic acid alkyl ester is preferably from 1 to 12, and more preferably from 3 to 10.

Examples of the (meth)acrylic acid alkyl ester as a polymer-constituting unit component include: propyl (meth) acrylate, butyl (meth)acrylate, hexyl (meth)acrylate, octyl (meth)acrylate, 2-methylpropyl (meth)acrylate, 2-ethylpropyl (meth)acrylate, 2-methylbutyl (meth)acrylate, 2-ethylbutyl (meth)acrylate, 2-methylhexyl (meth)acrylate, 3-methylhexyl (meth)acrylate, 2-ethylhexyl (meth)acrylate, 1,2-dimethylbutyl (meth)acrylate, and the like.

Examples of the metal ion include: alkali metal ions, such as Na ion, K ion, or Li ion; divalent metal ions, such as Ca ion, Mg ion, and Zn ion; trivalent metal ions, such as Al ion, or Nd ion; and a mixture thereof. Na ion, Zn ion, or Li ion is preferably used, for example, terpolymer, from the aspect of durability. Further, Mg ion is also preferred.

Specific examples of the terpolymer-based ionomer resin, which are exemplified by the below trade name, include: HIMIRAN 1856 (Na), HIMIRAN 1855 (Zn), HIMIRAN AM7316 (Zn), and the like, each of which is commercially available from DuPont Mitsui Polychemicals Co., Ltd.; and SURLYN AD8265 (Na), SURLYN AD8269 (Na), and the like, each of which is commercially available from DuPont. Note that, Na, Zn, K, Li, Mg, and the like, as shown in parentheses, after the trade name of the ionomer resin, indicate: a kind of metal for the neutralization metal ion.

In the present invention, as the resin which is contained in the substrate film 5a, use may be made for containing a resin other than the ionomer resin comprising a terpolymer crosslinked by a metal ion.

Examples of this resin include resins, such as polypropylene/elastomer, polybutylene terephthalate (PBT) and the like.

In the present invention, a content of the ionomer resin in the substrate film is preferably from 5 to 100 mass % and more preferably from 10 to 70 mass %.

An arithmetic average roughness Ra (JIS B 0601-2001) of a surface of the substrate film 5a in the contact interface to an electrostatic chuck table, is from 0.1 to 3.0 μm in the present invention. It is difficult to produce a film so as to be more flat and smooth if thinner than 0.1 μm. If a film is rougher than 3.0 μm, heat of the substrate film 5a becomes less able to be transferred to the electrostatic chuck table, which results in difficulty in suppressing temperature elevation of the substrate film 5a.

In the present invention, the arithmetic average roughness Ra of a surface roughness of the substrate film 5a is preferably 1.0 to 3.0 μm, more preferably 2.0 to 3.0 μm, and still more preferably 2.5 to 3.0 μm.

The arithmetic average roughness Ra of a surface roughness of the substrate film 5a can be controlled to an intended range, for example, by embossing with unevenness of the casting roll at the time of film casting, or by carrying out sandblast processing or chemical matte-processing with any of chemicals, as a secondary processing.

Further, a rate of heat shrinkage of the substrate film 5a after heating at 100° C. for 10 minutes is preferably less than 4%, more preferably 3% or less, still more preferably 2% or less, and particularly preferably 1% or less. If the rate of heat shrinkage is 4% or more, there is a high possibility that singulated chips 7 after plasma dicing bumps into each other, which results in damages of the chips 7. It is contemplated that if the rate of heat shrinkage is 3% or less, there would be almost no adverse affection due to heat history.

The rate of heat shrinkage of the substrate film 5a can be controlled to an intended range, for example, by decreasing a film tensile stress at the time of extrusion molding, or slowly lowering the cooling temperature under control after film formation.

A thickness of the substrate film 5a is preferably from 20 to 200 μm and more preferably from 80 to 150 μm, from the viewpoint of strength-elongation property and radiation permeation property.

<Temporary-Adhesive Layer>

The temporary-adhesive layer 5b is required to have both heat resistance as a resistance to plasma dicing or plasma ashing, and a peeling-off property in the picking-up of a chip 7. For this reason, in the temporary-adhesive layer, it is possible to use a non-curable temporary-adhesive having the foregoing properties; and a radiation polymerization-type temporary-adhesive, such as an ultraviolet curable temporary-adhesive, and an ionizing radiation curable temporary-adhesive, which is like an electron beam curable temporary-adhesive, in which the temporary-adhesive is three-dimensionally reticulated with preferably due to radiation curable temporary-adhesive and more preferably due to ultraviolet curable temporary-adhesive, thereby for adhesion force is lowered, and in addition, a residue, such as a temporary-adhesive hardly occurs on a surface after peeling-off the temporary-adhesive layer.

Note that, the radiation is a concept: including a light beam, such as ultraviolet; and an ionizing radiation, such as an electron beam.

Examples of the forgoing temporary-adhesive include: an acrylic temporary-adhesive; and a temporary-adhesive which is composed of this acrylic temporary-adhesive and a radiation polymerizable compound as a main component.

The acrylic temporary-adhesive contains a (meth)acrylic copolymer and a curing agent as components. Examples of the (meth)acrylic copolymer include: a copolymer of a polymer composed of a (meth)acrylic acid ester as a polymer-constituting unit component, and a (meth)acrylic polymer which constitutes a (meth)acrylic acid ester-based copolymer, or a functional monomer, such as a (meth)acrylic acid, a hydroxy-substituted alkyl ester of the (meth)acrylic acid, or the like; and a mixture of these polymers. As for the mass-average molecular weight of these polymers, those having a molecular weight as high as a range of about 500,000 to about 1,000,000 are generally applied to.

The curing agent is used for adjusting a adhesion force and a cohesion force, by conducting reaction of it with a functional group (for example, hydroxy, carboxy, epoxy groups, or the like) of the (meth)acrylic copolymer. Examples of the curing agent include: an epoxy compound having 2 or more epoxy groups in the molecule, such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, or N,N,N',N'-tetraglycidyl-m-xylenediamine; an isocyanate-based compound having 2 or more isocyanate groups in the molecule, such as 2,4-tolylenediisocyanate, 2,6-tolylenediisocyanate, 1,3-xylylenediisocyanate, 1,4-xylylenediisocyanate, or diphenyl-methane-4,4'-diisocyanate; an aziridine-based compound having 2 or more aziridinyl groups in the molecule, such as tetramethylol-tri-β-aziridinyl propionate, trimethylol-tri-β-aziridinyl propionate, trimethylolpropane-tri-β-aziridinyl propionate, or trimethylolpropane-tri-β-(2-methylaziridine) propionate; and the like. An addition amount of the curing agent may be adjusted depending on a desired adhesion force, and is suitably from 0.1 to 5.0 mass parts with respect to 100 mass parts of the (meth)acrylic copolymer.

Further, the radiation-curable temporary-adhesive is called as a radiation curable-type temporary-adhesive, while the radiation non-curable temporary-adhesive is called as a pressure-sensitive temporary-adhesive.

Generally, the radiation curable-type temporary-adhesive is composed of the acrylic temporary-adhesive and a radiation-polymerizable compound as main components. As for the radiation-polymerizable compound, use may be widely made of a low-molecular weight compound having, in the molecule, at least two or more photopolymerizable carbon-carbon double bonds which can be three-dimensionally reticulated by, for example, ultraviolet irradiation. Specifically, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, oligo-ester acrylates, and the like.

Further, in addition to the forgoing acrylate-based compounds, use can be also made of: a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, methylene diphenyl-4,4'-diisocyanate, and the like).

As a blending ratio of the acrylic temporary-adhesive and the radiation-polymerizable compound in the radiation curable-type temporary-adhesive, the radiation-polymerizable compound is desirably blended in the range of 50 to 200 mass parts and preferably 50 to 150 mass parts with respect to 100 mass parts of the acrylic temporary-adhesive. If the blending ratio is in this range, the adhesion force of the temporary-adhesive layer after radiation irradiation is sharply declined.

Further, as the radiation curable-type temporary-adhesive, it is also possible to change the acrylic temporary-adhesive itself to the radiation-polymerizable acrylic acid ester copolymer, in place of blending the radiation-polymerizable compound with the acrylic temporary-adhesive, as mentioned above.

The radiation-polymerizable acrylic acid ester copolymer is a copolymer having, in the molecule of the copolymer, a reactive group which is capable of realizing a polymerization reaction upon exposure to a radiation, particularly to an ultraviolet ray. As the forgoing reactive group, an ethylenically unsaturated group, in other words, a group having a carbon-carbon double bond, is preferred. Examples thereof include: a vinyl group, an allyl group, a styryl group, a (meth)acryloyloxy group, a (meth)acryloylamino group, and the like.

This reactive group can be obtained, for example, by conducting reaction of a copolymer having a hydroxy group at the side chain of the copolymerized polymer, with a compound having a reactive group with the hydroxy group, for example, an isocyanate group or the like, and also having the reactive group which is capable of realizing a polymerization reaction upon exposure to an ultraviolet ray [representatively 2-(meth)acryloyloxyethyl isocyanate].

Hereinafter, the polymer having an ethylenically unsaturated group is described in detail.

The polymer having an ethylenically unsaturated group is not limited in particular but any compound may be used. However, a (meth)acrylic copolymer is preferred. The iodine value which gives an indication of the amount of double bond contained in the polymer is preferably from 0.5 to 20. This iodine value is more preferably from 0.8 to 10.

As for the polymer having an ethylenically unsaturated group, how it is produced does not matter. However, it is preferred to apply a method of conducting reaction of a (meth)acrylic polymer having a functional group (α) at the side chain thereof, with a compound having an ethylenically unsaturated group and a functional group (β) which conducts reaction with the functional group (α) in the polymer, thereby for introducing the ethylenically unsaturated group into the side chain of the (meth)acrylic polymer.

The ethylenically unsaturated group is not limited in particular but any group may be used. However, a (meth) acryloyl group, a (meth)acryloyloxy group, a (meth)acryloylamino group, an allyl group, a 1-propenyl group, or a vinyl group (including styrene or a substituted styrene) is preferred, and a (meth)acryloyl group or a (meth)acryloyloxy group is more preferred. Examples of the functional group (β) which conducts reaction with the functional group (α) include: a carboxy group, a hydroxy group, an amino group, a mercapto group, a cyclic acid anhydride group, an epoxy group, an isocyanate group, and the like.

Herein, when one of the functional group (α) or the functional group (β) is: a carboxy group, a hydroxy group, an amino group, a mercapto group, or a cyclic acid anhydride group, examples of the other functional group include: an epoxy group and an isocyanate group. When one functional group is: a cyclic acid anhydride group, examples of the other functional group include: a carboxy group, a hydroxy group, an amino group, and a mercapto group. Note that, when one functional group is an epoxy group, the other functional group may be an epoxy group.

The (meth)acrylic polymer having a functional group (α) at the side chain thereof, is obtained by polymerizing a (meth)acrylic acid ester, an acrylic acid, or a (meth)acrylamide, each of which has a functional group (α). Examples of the functional group (α) include: a carboxy group, a hydroxy group, an amino group, a mercapto group, a cyclic acid anhydride group, an epoxy group, an isocyanate group, and the like. A carboxy group and a hydroxy group are preferred. In particular, a hydroxy group is preferred.

Examples of such a monomer include: acrylic acid, methacrylic acid, cinnamic acid, itaconic acid, fumaric acid, phthalic acid, 2-hydroxyalkyl acrylates, 2-hydroxyalkyl methacrylates, glycol monoacrylates, glycol monomethacrylates, N-methylol acrylamide, N-methylol methacrylamide, allyl alcohol, N-alkylaminoethyl acrylates, N-alkylaminoethyl methacrylates, acrylamides, methacrylamides, maleic anhydride, itaconic anhydride, fumaric anhydride, phthalic anhydride, glycidyl acrylate, glycidyl methacrylate, allyl glycidyl ether, and polyisocyanate compounds in which isocyanato groups are partially urethanated with a monomer having a hydroxy group or carboxy group and a radiation-curable carbon-carbon double bond. Among these monomers, acrylic acid, methacrylic acid, 2-hydroxyalkyl acrylates, 2-hydroxyalkyl methacrylates, glycidyl acrylate, and glycidyl methacrylate are preferred. Acrylic acid, methacrylic acid, 2-hydroxyalkyl acrylates, and 2-hydroxyalkyl methacrylates are more preferred. 2-Hydroxyalkyl acrylates and 2-hydroxyalkyl methacrylates are still more preferred.

As the polymer having an ethylenically unsaturated group, particularly as the copolymer having an ethylenically unsaturated group, preferred are copolymers of other monomers, such as a (meth)acrylic acid ester, together with the monomers. Examples of the (meth)acrylic acid ester include: methyl acrylate, ethyl acrylate, n-propyl acrylate, n-butyl acrylate, isobutyl acrylate, n-pentyl acrylate, n-hexyl acrylate, n-octyl acrylate, isooctyl acrylate, 2-ethylhexyl acrylate, dodecyl acrylate, decyl acrylate, hexyl acrylate, and methacrylates corresponding to these acrylates. The (meth)acrylic acid ester may be one kind or two or more kinds. However, it is preferred to use an ester whose alcoholic moiety has 5 or less carbon atoms in combination with an ester whose alcoholic moiety has 6 to 12 carbon atoms. As the copolymer having an ethylenically unsaturated group, preferred are those in which a (meth)acrylic acid is further copolymerized, together with a (meth)acrylic acid ester.

A polymerization reaction of the polymer having an ethylenically unsaturated group, particularly the copolymer having an ethylenically unsaturated group, may be any of solution polymerization, emulsion polymerization, bulk polymerization, and suspension polymerization. In the case of conducting reaction of a (meth)acrylic resin having a functional group (α) at the side chain thereof, and a compound having an ethylenically unsaturated group and a functional group (β) which conducts reaction with the functional group (α) in the resin, temporary-adhesion property and modulus of elasticity can be desirably adjusted, by conducting reaction of any of these reactants so that one reactant is excessive in amount, thereby for remaining unreacted functional groups.

As a polymerization initiator, use may be generally made of a radical occurring agent of azobis-based, such as α,α'-azobisisobutyronitrile, and organic peroxide-based, such as benzoylperoxide. At this time, a catalyst, a polymerization inhibitor, and the like can be optionally added, if necessary. In this way, it is possible to obtain a resin with a desired molecular weight, by controlling a polymerization temperature and a polymerization time. As for the control of the molecular weight, it is preferred to use a mercaptan-based or carbon tetrachloride-based solvent.

A mass-average molecular weight of the polymer having an ethylenically unsaturated group is preferably from about 200,000 to about 1,500,000 and more preferably from about 700,000 to about 1,200,000. By reducing a low-molecular weight component, a surface contamination of the semiconductor wafer can be suppressed. For example, it is preferred to control molecules having a molecular weight of 100,000 or less so as to be 10% or less of the total. If the molecular weight exceeds 1,500,000, there is a possibility of gelation upon synthesis and coating.

Then, the description is made of: the compound having an ethylenically unsaturated group, and a functional group (β) that conducts reaction with the functional group (α) which the (meth)acrylic polymer has.

As the ethylenically unsaturated group, the above-mentioned groups are preferred and a preferable range thereof is also the same. Examples of the functional group (β) that conducts reaction with the functional group (α) include: such groups as mentioned above. As the functional group (β), an isocyanate group is particularly preferred.

Examples of the compound having an ethylenically unsaturated group and a functional group (β) that conducts reaction with the functional group (α) include: a monomer compound having a functional group (α); and a (meth) acrylate having an isocyanate group in the alcohol moiety thereof. Of these compounds, preferred is a (meth)acrylate having an isocyanate group in the alcohol moiety thereof. As the (meth)acrylate having an isocyanate group in the alcohol moiety thereof, preferred are those having an isocyanate group at the end of the alcohol moiety. The carbon number of alcohol moieties except for the isocyanate group, is preferably from 2 to 8. The alcohol moiety is preferably composed of a straight-chain alkyl group. Preferable examples of the (meth)acrylate having an isocyanate group in the alcohol moiety thereof include: 2-isocyanatoethyl acrylate and 2-isocyanatoethyl methacrylate.

In the case of conducting polymerization of a temporary-adhesive layer by radiation, such as an ultraviolet ray and the like, a temporary-adhesive can be used in combination with a photopolymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylpheny propane, and the like. By adding at least one of these compounds to the temporary-adhesive layer, a polymerization reaction can be efficiently accelerated.

Even in the case of conducting polymerization of a temporary-adhesive layer by radiation, such as an ultraviolet ray and the like, it is preferred to add the above-described curing agent to the temporary-adhesive layer. Further, it is also preferred to use a photosensitizer in combination with the photopolymerization initiator.

One of preferable embodiments is a temporary-adhesive, in which, to an acrylic temporary-adhesive composed of a copolymer of 2-ethylhexyl acrylate and n-butyl acrylate, a (meth)acrylate compound having an ultraviolet-curable carbon-carbon double bond is contained, and in which a photopolymerization initiator and a photosensitizer are blended.

In addition, hitherto known, any of a tackifier, a softener, a plasticizer, an antioxidant, and the like may be contained in the temporary-adhesive layer.

The thickness of the temporary-adhesive layer 5b is preferably from 5 to 100 μm, more preferably from 5 to 30 μm, and most preferably from 10 to 20 μm. Note that, if the thickness is less than 5 μm, there is a possibility that protection of the element or the like formed on the patterned face 2 would become insufficient.

<Other Layer>

As the wafer-fixing tape 5, in order to facilitate transition to a die-bonding step after picking-up, it is also possible to use a die-bonding tape, in which a die-bonding adhesive is interposed between the temporary-adhesive layer 5b and the substrate film 5a.

<Characteristics of Wafer-Fixing Tape>

(Thermal Conductivity)

A thermal conductivity of the wafer-fixing tape 5 is preferably 0.2 W/m·K or more, more preferably 0.2 W/m·K or more and 5.0 W/m·K or less, still more preferably 1.0 W/m·K or more and 5.0 W/m·K or less, and particularly preferably 2.0 W/m·K or more and 5.0 W/m·K or less. If the thermal conductivity is less than 0.2 W/m·K, heat of the substrate film 5a is not transferred to an electrostatic chuck table, which results in difficulty in suppressing temperature elevation of the substrate film 5a. With a higher thermal conductivity, the heat becomes easier to be transferred to the electrostatic chuck table. However, a practical thermal conductivity is 5.0 W/m·K or less.

(Change of Adhesion Force to Silicon after Heating)

A change in adhesion force of the temporary-adhesive layer 5b of the wafer-fixing tape 5 to the semiconductor wafer 1 or the chip 7 after heating at 100° C. for 10 minutes, is preferably 0.3 N/25-mm or less, more preferably 0.15 N/25-mm or less, and still more preferably 0.1 N/25-mm or less.

If the change of adhesion force after heating at 100° C. for 10 minutes is more than 0.3 N/25-mm, there is a high risk of occurring adverse affection on a picking-up performance. If the change of adhesion force after heating at 100° C. for 10 minutes is 0.3 N/25-mm or less, there is only a low risk of occurring adverse affection on a picking-up performance. If the change of adhesion force after heating at 100° C. for 10 minutes is 0.15 N/25-mm or less, it is contemplated that there is no influence due to a heat history.

Herein, the change of adhesion force is an absolute value of the difference, which is obtained by subtracting the adhesion force after the heating from the adhesion force before the heating at 100° C. for 10 minutes.

(Electrostatic Adsorption Power)

The electrostatic adsorption power of the wafer-fixing tape 5 to an electrostatic chuck table is preferably 200 Pa or more, more preferably 300 Pa or more, still more preferably 300 Pa or more and 1,500 Pa or less, and particularly preferably from 700 Pa to 1,000 Pa. If the electrostatic adsorption power is less than 200 Pa, the wafer-fixing tape 5 seldom sticks fast to the electrostatic chuck table.

If the electrostatic adsorption power is more than 200 Pa and less than 300 Pa, adhesion of the wafer-fixing tape 5 to an electrostatic chuck table is scarce. As a result, sometimes, heat of the substrate film 5a becomes less able to be transferred to the electrostatic chuck table. For this reason, the electrostatic adsorption power is more preferably 300 Pa or more. Further, if the electrostatic adsorption power is 700 Pa or more, adhesion of the wafer-fixing tape 5 to the electrostatic chuck table is so high that a heat transfer is apt to cause.

(Total Outgas Yield)

Further, the total outgas yield of the wafer-fixing tape 5 at 100° C. is preferably 0.3 mass % or less, more preferably 0.15 mass % or less, still more preferably 0.10 mass % or less, and particularly preferably 0.05 mass % or less.

If the outgas yield is more than 0.15 mass %, there is a risk of occurring adverse affection on a patterned face 2 of the chip 7.

(Plasma Resistance of Temporary-Adhesive Layer)

In the present invention, since the plasma dicing is practiced, plasma resistance is required.

The slower the plasma-etching speed is, the longer the time period in which the temporary-adhesive layer 5b of the wafer-fixing tape 5 contacts with plasma is. As the time period becomes longer, the temporary-adhesive layer 5b is attacked and suffers damages, such as decomposition and deterioration, which results in an inability to hold the chips 7. For this reason, by finding out an etching speed at which the temporary-adhesive layer 5b does not suffer any damage, plasma resistance can be evaluated.

In the present invention, an etching speed of the temporary-adhesive layer 5b of the wafer-fixing tape 5 by $SF_6$ plasma and $O_2$ plasma is preferably 2.0 μm/min or less, more preferably 1.0 μm/min or less, still more preferably 0.5 μm/min or less, and particularly preferably less than 0.1 μm/min. If the etching speed by $SF_6$ plasma and $O_2$ plasma is more than 2.0 μm/min, the wafer-fixing tape 5 is attacked, which results in an inability to hold the chips 7. If the etching speed is less than 0.1 μm/min, it is contemplated that there is no influence due to plasma. However, even if the etching speed is 0.1 μm/min or more, there is almost no risk of causing a disadvantage at each treatment step. At least 0.1 μm/min or more and 2.0 μm/min or less is a desirable range.

Herein, the etching process of Si in the semiconductor wafer using a $SF_6$ gas is also called as a BOSCH process. This process is composed of conducting reaction of an exposed Si and F atoms formed by plasmarizing $SF_6$, thereby for forming silicon tetrafluoride ($SiF_4$), and then removing the thus-formed silicon tetrafluoride, which is also called as a reactive ion etching (RIE). On the other hand, the removal by $O_2$ plasma, is a method which is also used as a plasma-cleaner in a manufacturing process of the semiconductor, and which is also called as ashing (ash making), and is one of methods for removing anti-organic substance. This method is carried out to clean a residue of the organic substance having remained on the surface of the semiconductor device.

<<Processing Method of Semiconductor Wafer of the Present Invention>>

Hereinafter, preferable embodiments of the processing method of the semiconductor wafer of the present invention are described with reference to drawings.

In the present invention, the processing method of the semiconductor wafer is classified into the following preferable embodiments.

However, the present invention is not limited to those embodiments described below.

First Embodiment [FIG. 1(a) to FIG. 4(c)]

A singulation method of the semiconductor wafer which is a preferable first embodiment of the present invention is described with reference to FIG. 1(a) to FIG. 4(c).

A semiconductor wafer 1 has a patterned face 2 on the surface S of which a circuit or the like of the semiconductor device is formed (see FIG. 1(a)). Onto this patterned face 2, a surface protective tape 3 is laminated (see FIG. 1(b)), thereby for obtaining the semiconductor wafer 1 whose patterned face 2 is covered with the surface protective tape 3 (see FIG. 1(c)).

Figure 2A:
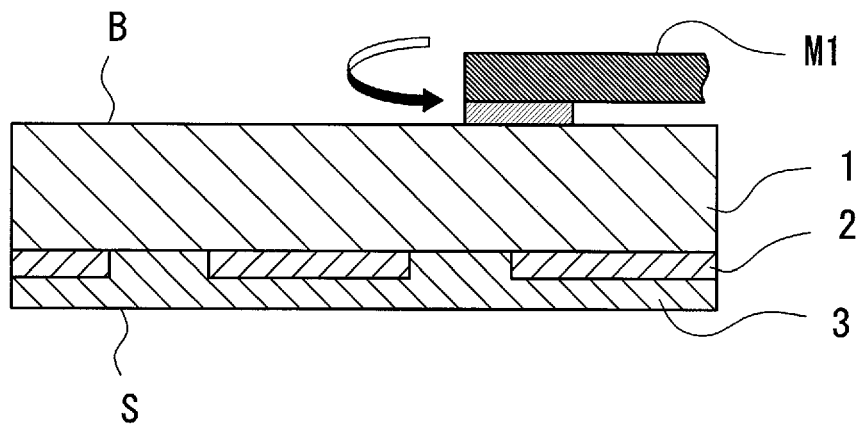
FIGS. 2(a) to 2(d) are schematic cross-sectional views illustrating steps until thinning of the semiconductor wafer and mask formation in the first embodiment of the present invention. Fragmentary
Figure 2B:
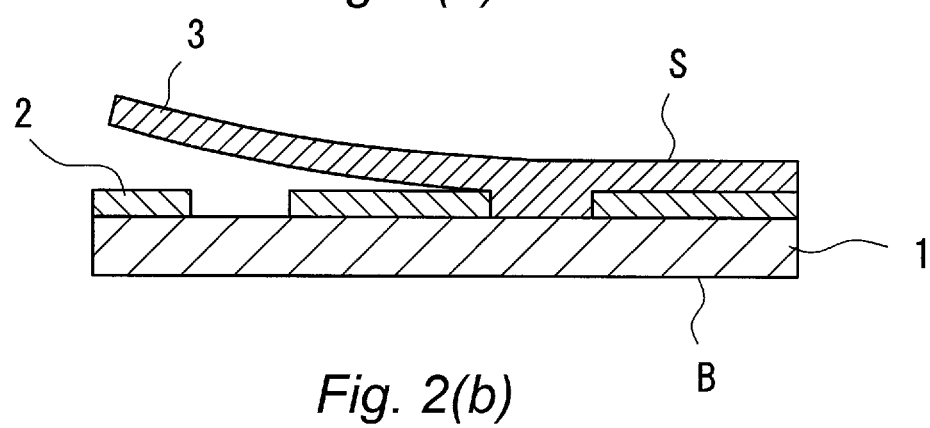
Figure 2C:
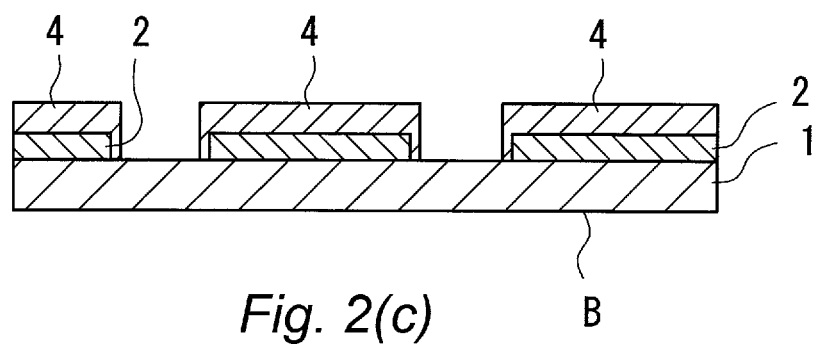
Figure 2D:
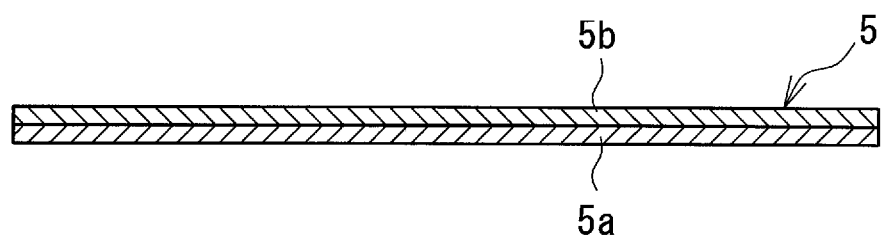

Then, the backing face B of the semiconductor wafer 1 is ground by a wafer-grinding apparatus M1, to thin a thickness of the semiconductor wafer 1 (see FIG. 2(a)). After that, the surface protective tape 3 is peeled off from the patterned face 2 (see FIG. 2(b)). On the exposed patterned face 2, a resist 4 is stacked according to an ordinary manner, to form a mask (see FIG. 2(c)). On the other hand, a wafer-fixing tape 5 to be laminated on the backing face of the wafer is prepared. This wafer-fixing tape 5 has a constitution that a temporary-adhesive layer 5b is stacked on a substrate film 5a (see FIG. 2(d)).

Figure 3A:
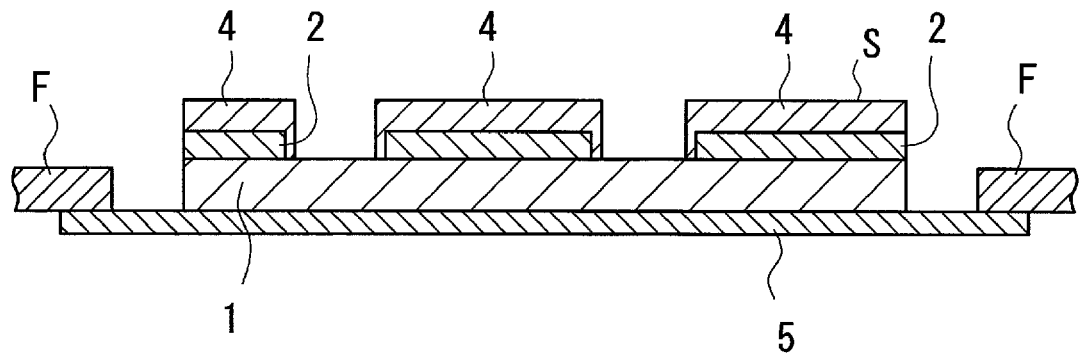
FIGS. 3(a) to 3(c) are schematic cross-sectional views illustrating steps until singulation into chips in the first embodiment of the present invention. Fragmentary
Figure 3B:
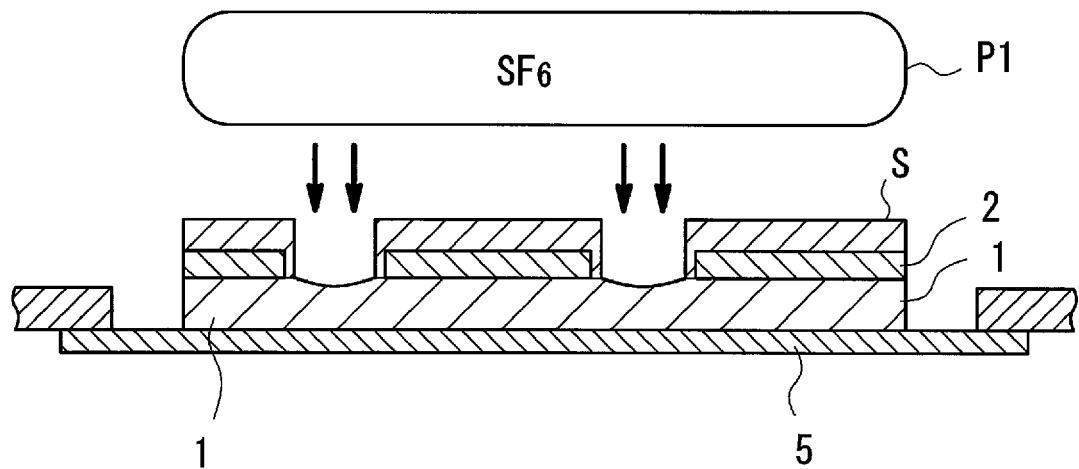
Figure 3C:
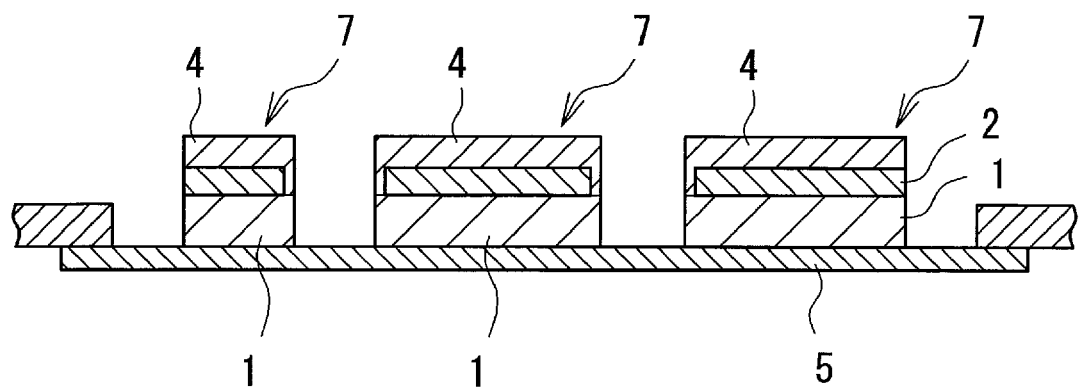

The wafer-fixing tape 5 is laminated on the ground backing face B of the semiconductor wafer 1, and is supported by and fixed to a ring frame F (see FIG. 3(a)). Then, a treatment with plasma P1 of $SF_6$ gas is carried out from the surface S side. By this, the semiconductor wafer 1 is etched (see FIG. 3(b)) and is divided into individual semiconductor chip (hereinafter, also referred to simply as "chip") 7, which results in singulation (see FIG. 3(c))

Figure 4A:
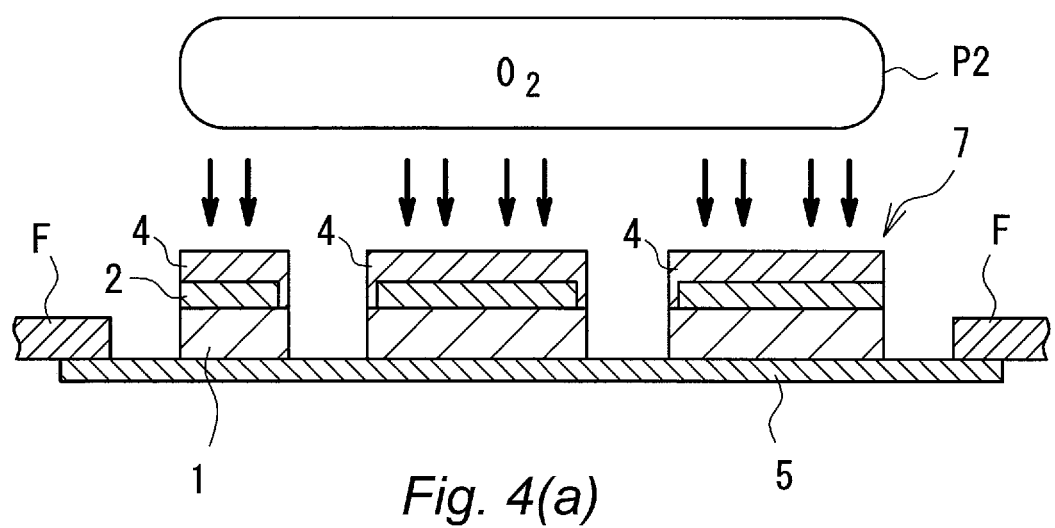
FIGS. 4(a) to 4(c) are schematic cross-sectional views illustrating steps until a chip is picked up in the first embodiment of the present invention. Fragmentary
Figure 4B:
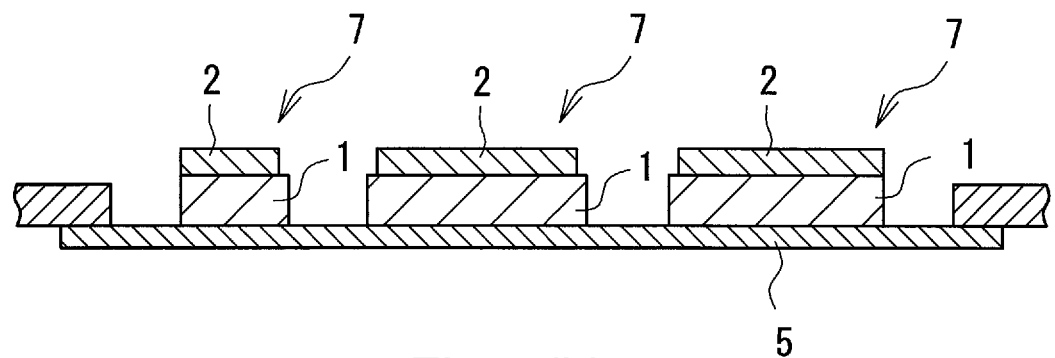
Figure 4C:
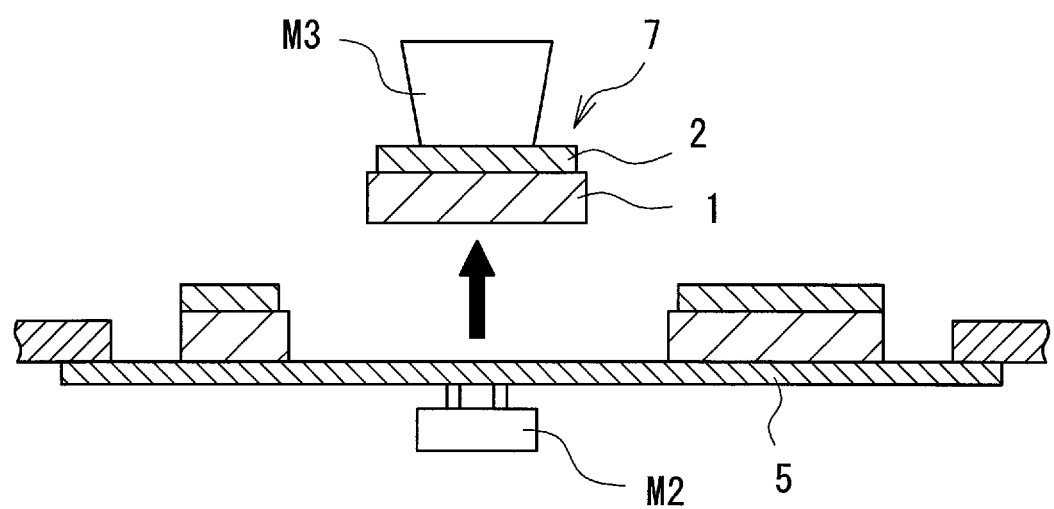

After that, ashing with plasma P2 of $O_2$ gas is carried out (see FIG. 4(a)), thereby to remove the resist 4 remaining on the surface S. By this, patterned face 2-exposed on the surface are obtained, to give singulated chips 7 (see FIG. 4(b)). Then, the chip 7 is knocked up by a pin M2 and is picked up by adsorption with a collet M3 (see FIG. 4(c)).

Note that, an etching speed by using $SF_6$ plasma and $O_2$ plasma is preferably 2.0 μm/min or less, more preferably 1.0 μm/min or less, and still more preferably 0.5 μm/min or less. As the lower limit of the etching speed, 0.1 μm/min or more is preferred.

Then, materials that can be used in the above method are described.

The semiconductor wafer 1 is a silicon wafer, on its one side, having the patterned face 2 on which the circuit or the like of the semiconductor device is formed. The patterned face 2 is a face on which the circuit or the like of the semiconductor device is formed.

The surface protective tape 3 has a function of protecting the semiconductor element formed on the patterned face 2. Specifically, at the wafer-thinning step which is a post-step, the patterned face 2 of the semiconductor wafer 1 is supported by the surface protective tape 3, and at the same time the backing face of the wafer is ground. Therefore, the surface protective tape 3 needs to withstand a load in grinding. For this reason, the surface protective tape 3 has: the thickness enough to coat the element formed on the patterned face 2; and the pressing resistance which is low, and has: a high adhesiveness that can adhere tightly to the element so that the infiltration of dusts, grinding water, and the like in grinding is not caused. As for this surface protective tape 3, use can be made of any of hitherto known arbitrary surface protective tapes.

For the resist 4, use can be made of any of hitherto known conventional ones, such as a resist which is used in the photolithographic step. Further, for the coating step to the patterned face 2, a spin coating and the like can be used. For example, a mask can be formed by a photolithographic step or the like.

In order to carry out plasma dicing and plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber. Thus, the semiconductor wafer 1 is placed on an electrostatic chuck table on the side of the electrode for a high-frequency wave, and a gas for plasma-occurrence is supplied from the side of a gas-supplying electrode provided facing the electrode for high-frequency wave. If a high-frequency voltage is applied to the electrode for a high-frequency wave, plasma is occurred between the gas-supplying electrode and the electrode for a high-frequency wave. Therefore, this plasma is used.

In the plasma dicing process, in the plasma-etching apparatus, the semiconductor wafer 1 is fixed on the electrostatic chuck table by the fixing system which is called as an electrostatic adsorption system. The inside of the plasma treatment apparatus is subjected to expose to high heat due to plasma-occurrence. Therefore, for the materials of the wafer-fixing tape 5 which is laminated onto the semiconductor wafer 1 or the like, heat resistance is needed. On the other hand, the electrostatic chuck table, to which the wafer-fixing tape 5 connects, is cooled by passing a refrigerant into the inside thereof, thereby to suppress temperature elevation of the wafer-fixing tape 5. Therefore, it has been found that the higher the adsorptive property of the wafer-fixing tape 5 to the electrostatic chuck table, the more the wafer-fixing tape 5 is adaptable to the plasma dicing process, even if heat resistance of the wafer-fixing tape 5 is low. In contrast, in the case where the adsorptive property thereof is law, a risk of fusion increases because the wafer-fixing tape 5 is subjected to high heat of the plasma atmosphere. It has also found that in the electrostatic adsorption system in particular, the surface roughness of the wafer-fixing tape 5 influences an adsorptive property to the electrostatic chuck table.

The foregoing wafer-fixing tape 5 is composed of the temporary-adhesive layer 5b provided on the substrate film 5a, the substrate film 5a containing an ionomer resin comprising a terpolymer crosslinked by a metal ion.

In particular, in the present invention, as the wafer-fixing tape 5, the use of the above wafer-fixing tape 5 of present invention is preferred.

According to the processing method of the semiconductor wafer, resulting from the use of a prescribed wafer-fixing tape 5, it is possible to endure plasma dicing and plasma ashing steps and to reasonably carry out these steps without causing any chipping, and at the same time, it is possible to carry out a picking-up step with a good yield in the subsequence picking-up step Further, because the resist 4 can be removed by $O_2$ plasma, removal of the mask portion can be carried out by the same apparatus as that of carrying out the plasma dicing. In addition, because the plasma dicing is carried out from the side of the patterned face 2 (the surface S side), it is not necessary to turn the chip upside down before a picking work. For these reasons, high-quality chips can be produced in large quantities, so that a process cost can be considerably reduced.

As for a first embodiment, modified examples are also preferred, in which the first embodiment is partially changed as described below.

Figure 5A:
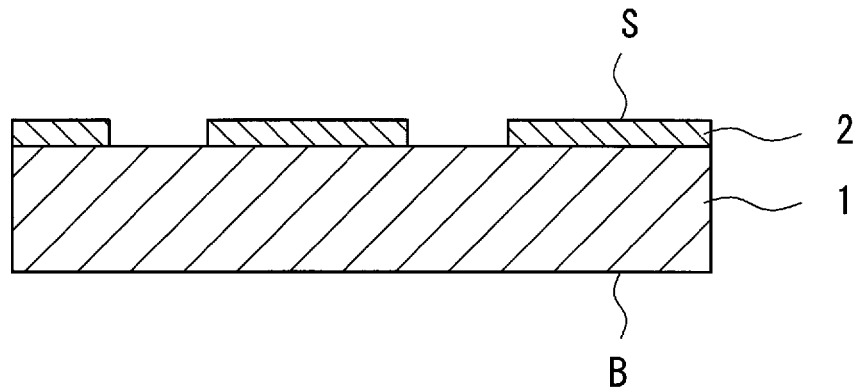
FIGS. 5(a) to 5(c) are schematic cross-sectional views illustrating steps until a surface protective tape is laminated onto a semiconductor wafer in a modified example of the first embodiment of the present invention. Fragmentary
Figure 5B:
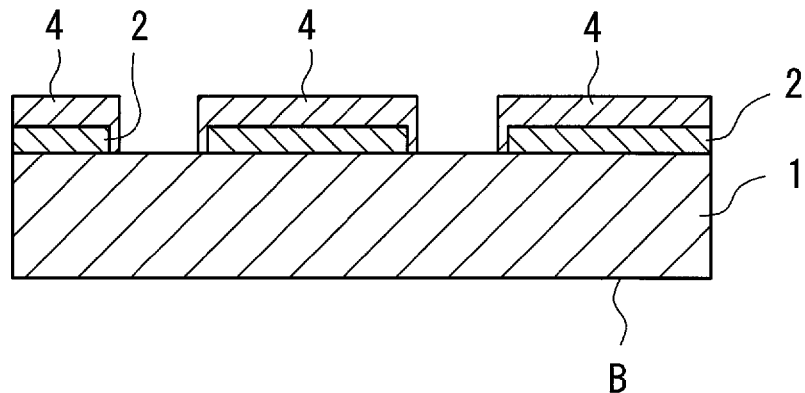
Figure 5C:
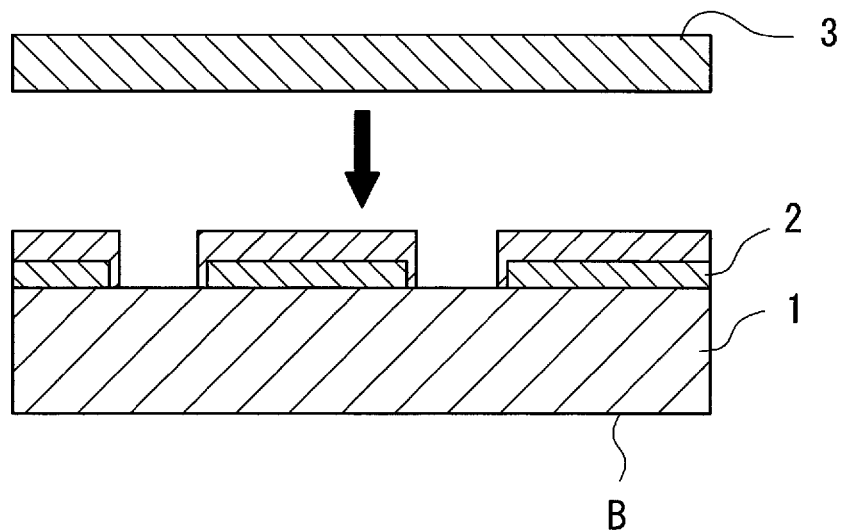
Figure 6A:
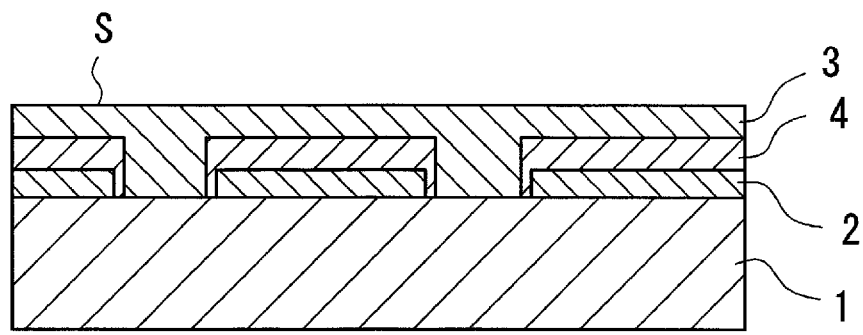
FIGS. 6(a) to 6(c) are schematic cross-sectional views illustrating steps until thinning of the semiconductor wafer and peeling-off of the surface protective tape in a modified example of the first embodiment of the present invention. Fragmentary
Figure 6B:
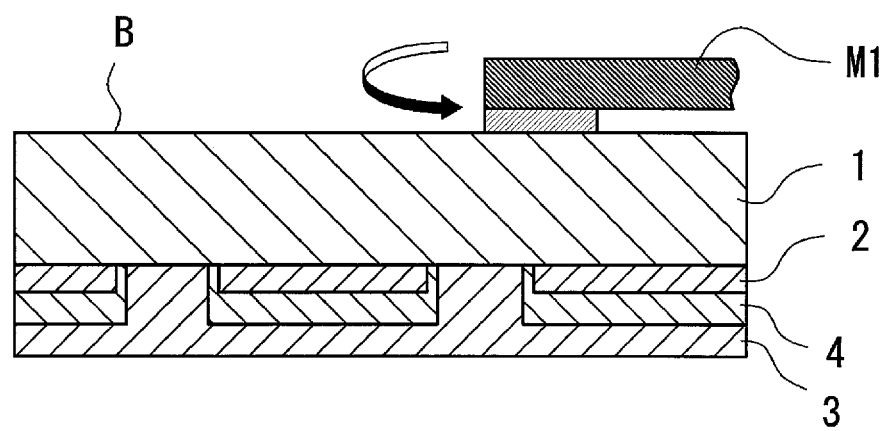
Figure 6C:
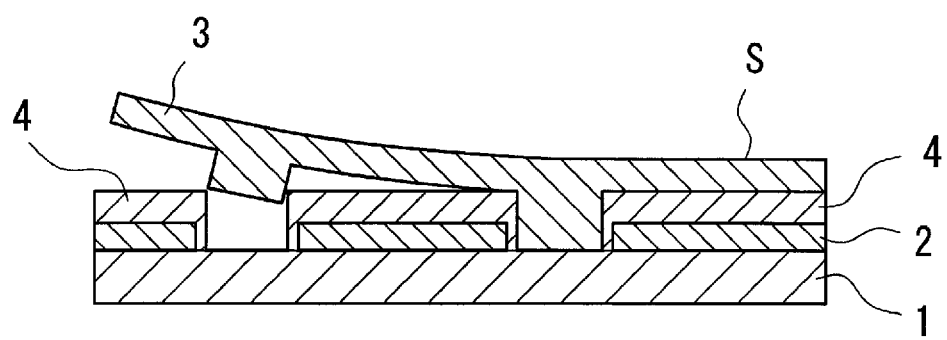

Modified Example 1-1 [FIG. 5(*a*) to FIG. 6(*c*)]

In the foregoing first embodiment, after thinning by grinding the semiconductor wafer 1, the resist 4 is formed. However, this embodiment is different form the first embodiment in the aspect that, after forming the mask with the resist 4, the semiconductor wafer 1 is thinned by grinding it. The other steps are the same as in the first embodiment.

Specifically, describing with reference to the drawings, on the surface S of the semiconductor wafer 1 (see FIG. 5(*a*)) having the patterned face 2 on which the circuit or the like of the semiconductor element is formed, the mask is formed by stacking the resist 4 in accordance with an ordinary manner (see FIG. 5(*b*)). The surface protective tape 3 is further laminated on the patterned face 2 on which this mask is formed (see FIG. 5(*c*)), thereby to obtain the semiconductor wafer 1 on which the patterned face 2 and the resist 4 are coated with the surface protective tape 3 (see FIG. 6(*a*)). Then, the thickness of the semiconductor wafer 1 is thinned, by grinding the backing face B of the semiconductor wafer 1 with the wafer-grinding apparatus M1 (see FIG. 6(*b*)). After that, the surface protective tape 3 is peeled-off from the patterned face 2 (see FIG. 6(*c*)). Further, the subsequent step(s) transfers to a treatment step by plasma P1 of $SF_6$ gas from the surface S side, in the same manner as in the first embodiment.

In this embodiment, before thinning the wafer, the resist 4 is formed, and therefore handling of the semiconductor wafer 1 is easy, and formation of the resist 4 is easy.

Figure 7A:
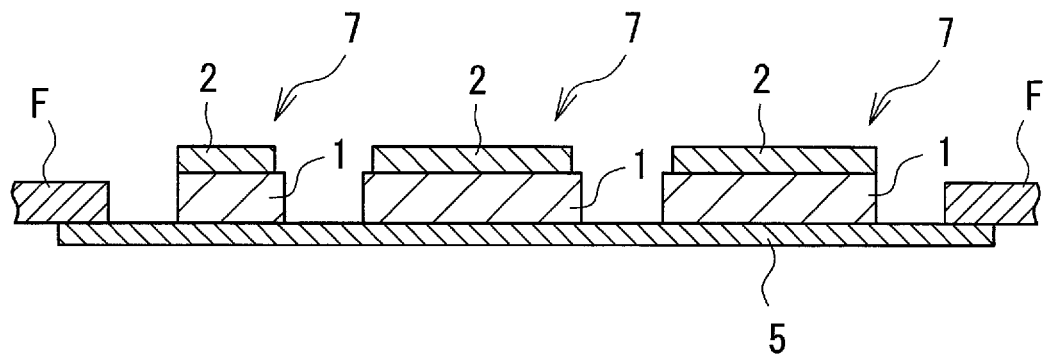
FIGS. 7(a) to 7(c) are schematic cross-sectional views illustrating steps until picking-up in another modified example of the first embodiment of the present invention. Fragmentary

Modified Example 1-2 [FIG. 7(*a*) to 7(*c*)]

This embodiment is different from the above embodiments in the aspect that before picking up a singulated chip 7, a step of transferring chips to a picking-up tape 6 is carried out.

Specifically, describing with reference to the drawings, an individual chip (see FIG. 7(*a*)) diced on the wafer-fixing tape 5 is transferred to a picking-up tape 6 (see FIG. 7(*b*)). Then, chips are knocked up with a pin M2 from the picking-up tape 6 side and are picked up with a collet M3 (see FIG. 7(*c*)). The other steps are the same as in the first embodiment or the modified example 1-1.

In this embodiment, because a step of transferring chips to the picking-up tape 6 is carried out, the collet M3 results in adsorption to the backing face B side of the chip 7. For this reason, the patterned face 2 can be protected so that the patterned face 2 is prevented from contacting with the collet M3.

Figure 8A:
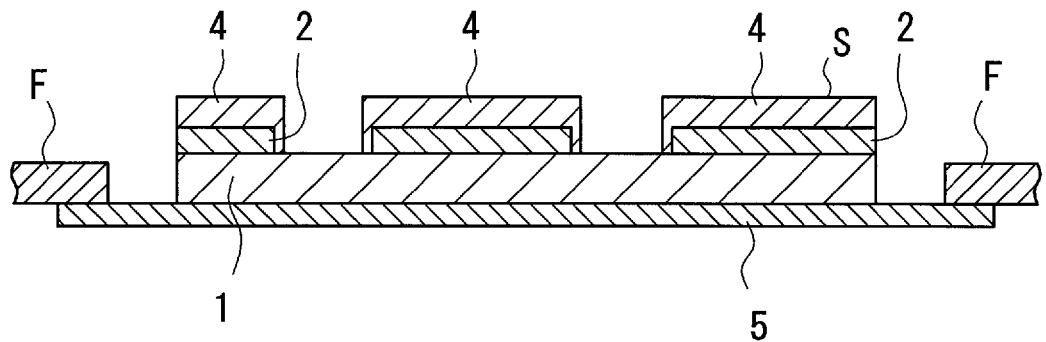
FIGS. 8(a) to 8(c) are schematic cross-sectional views illustrating steps before and after an ultraviolet ray irradiation in still another modified example of the first embodiment of the present invention. Fragmentary
Figure 8B:
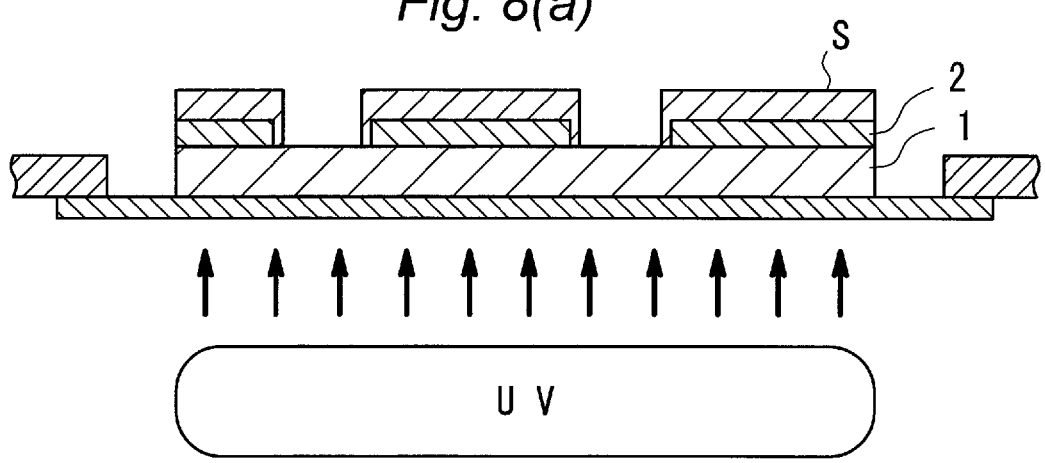
Figure 8C:
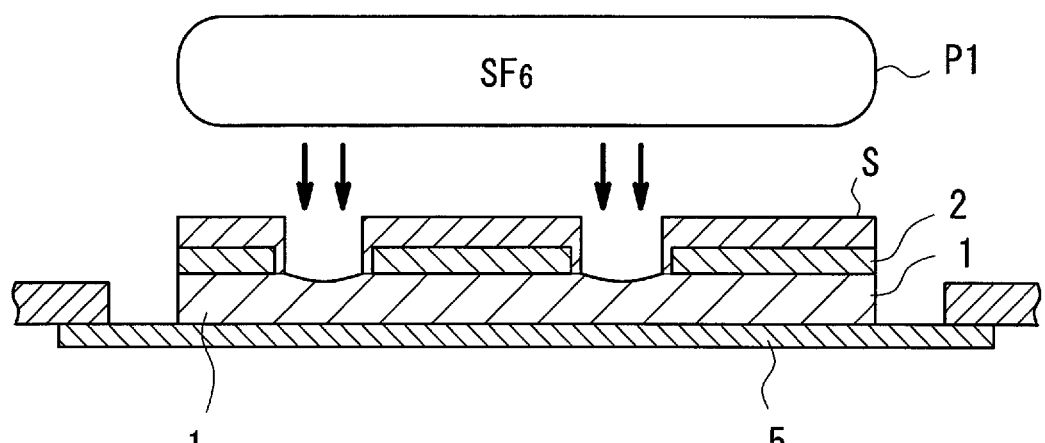

Modified Example 1-3 [FIG. 8(*a*) to 8(*c*)]

This embodiment is different from the first embodiment, the modified example 1-1, and the modified example 1-2 in the aspect that, before the picking-up step of the chip 7 in the first embodiment, a step of conducting crosslinking the temporary-adhesive layer 5*b* of the wafer-fixing tape 5 by irradiating an ultraviolet ray, is contained. The other steps are the same as in the first embodiment, the modified example 1-1, and the modified example 1-2.

For example, after providing the resist 4 on the patterned face 2 (see FIG. 8(*a*)), an ultraviolet ray is irradiated toward the wafer-fixing tape 5 from the backing face B side (see FIG. 8(*b*)). Then, after curing the temporary-adhesive layer 5*b* of the wafer-fixing tape 5, the subsequent step(s) transfers to the plasma-dicing step (see FIG. 8(*c*)).

In the wafer-fixing tape 5 that can be used in this embodiment, at variation with the wafer-fixing tape 5 described in the first embodiment, a material which is capable of being cured with a radiation, such as an ultraviolet ray or the like, is used in the temporary-adhesive layer 5*b*.

By curing the temporary-adhesive layer 5*b* with an ultraviolet ray or the like, picking-up of the chip 7 is made easy, and a plasma resistance in a plasma dicing can be improved.

Figure 9A:
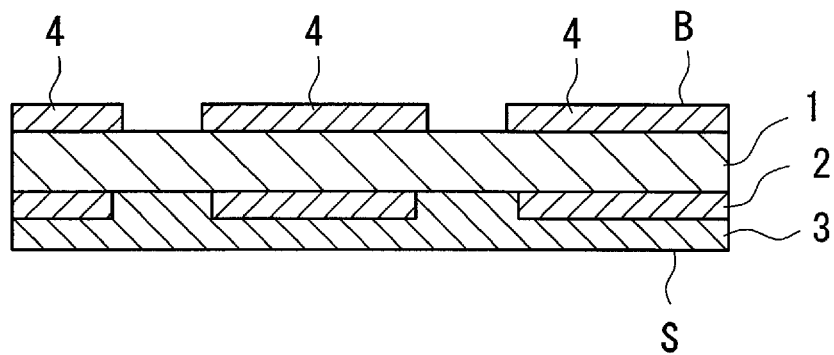
FIGS. 9(a) to 9(c) are schematic cross-sectional views illustrating steps until a wafer-fixing tape is laminated in a second embodiment of the present invention. Fragmentary
Figure 9B:
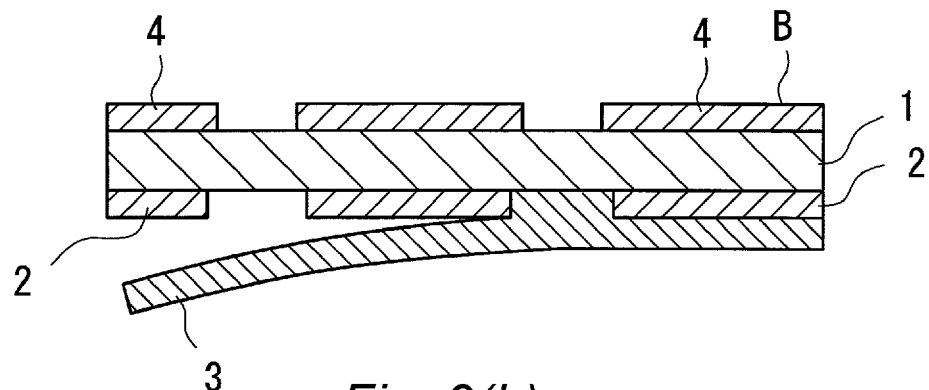
Figure 9C:
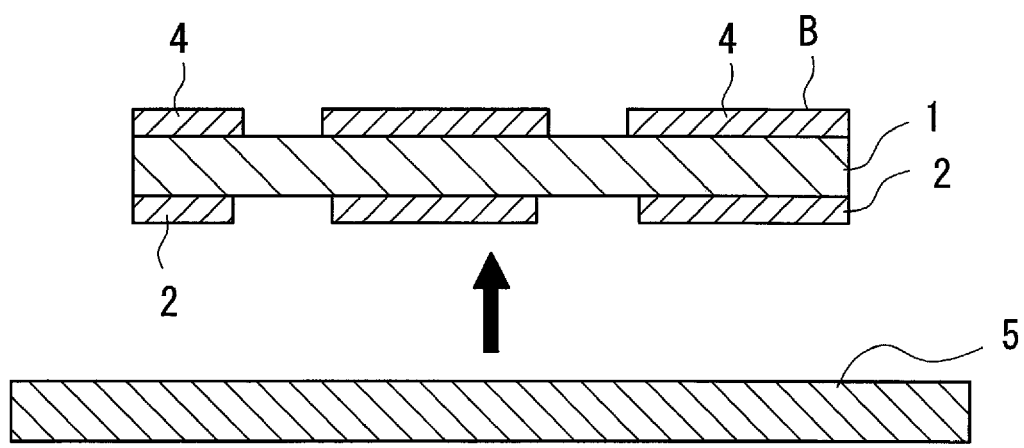
Figure 11A:
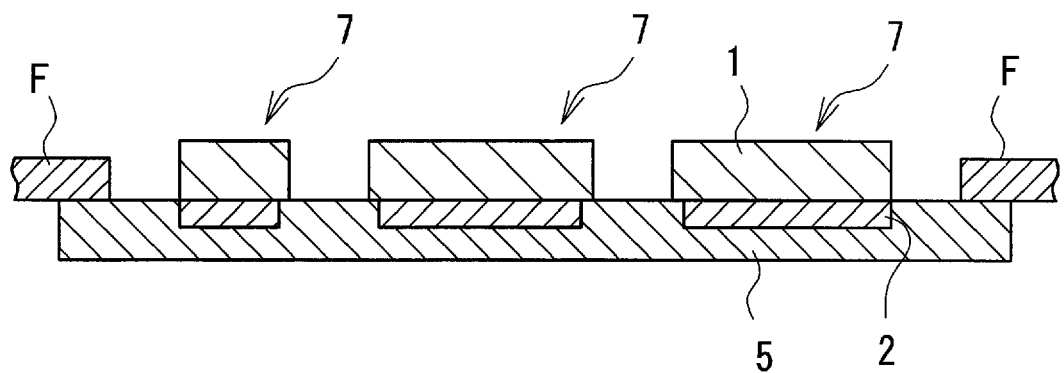
FIGS. 11(a) and 11(b) are schematic cross-sectional views illustrating steps until picking-up in the second embodiment of the present invention. Fragmentary
Figure 11B:
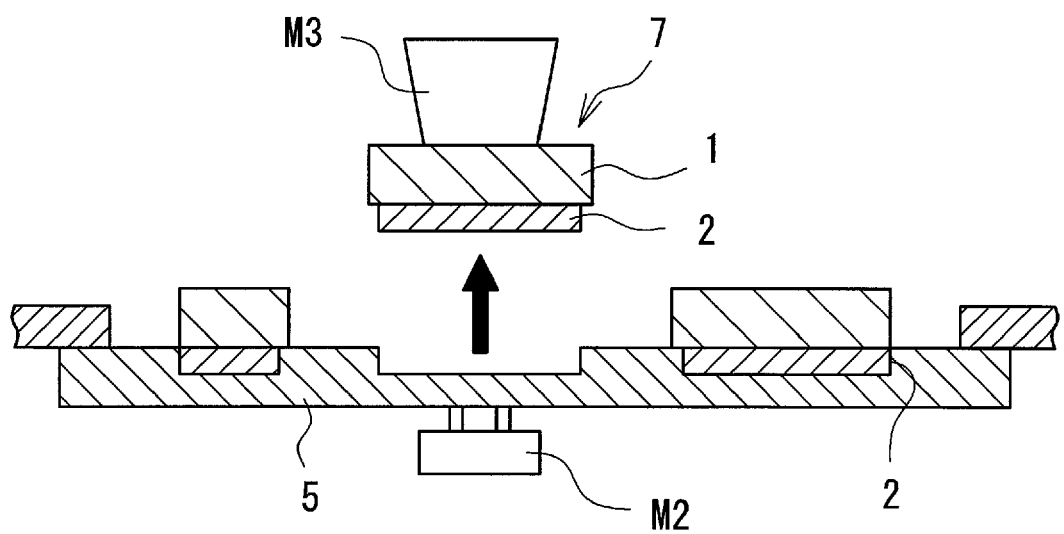

Second Embodiment [FIG. 9(*a*) to FIG. 11(*b*)]

In the first embodiment and the modified examples thereof, the resist 4 is provided at the surface S side on which the patterned face 2 was provided and the dicing is carried out from the surface S side. However, this embodiment is different from these embodiments in the aspect that the resist 4 is provided at the backing face B side of the semiconductor wafer 1 and the dicing is carried out from the backing face B side.

Specifically, describing with reference to the drawings, the surface protective tape 3 is laminated on the surface S side of the semiconductor wafer 1, and after thinning the wafer by grinding the backing face B side of the semiconductor wafer 1, the resist 4 is formed at the backing face B side of the ground wafer in accordance with an ordinary manner (see FIG. 9(*a*)). Then, the surface protective tape 3 is peeled off from the surface S side (see FIG. 9(*b*)), and then the wafer-fixing tape 5 is laminated on the peeled off surface of the wafer (see FIG. 9(*c*)).

Figure 10A:
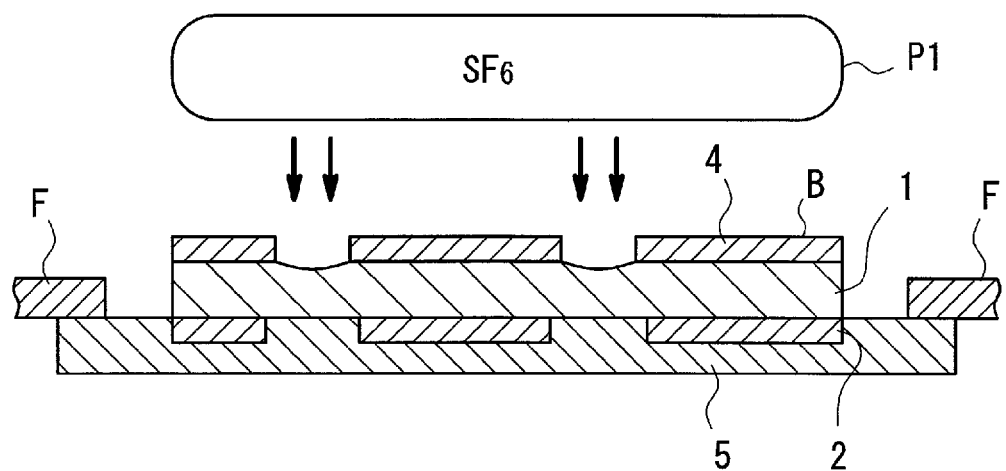
FIGS. 10(a) to 10(c) are schematic cross-sectional views illustrating steps until plasma ashing in the second embodiment of the present invention. Fragmentary
Figure 10B:
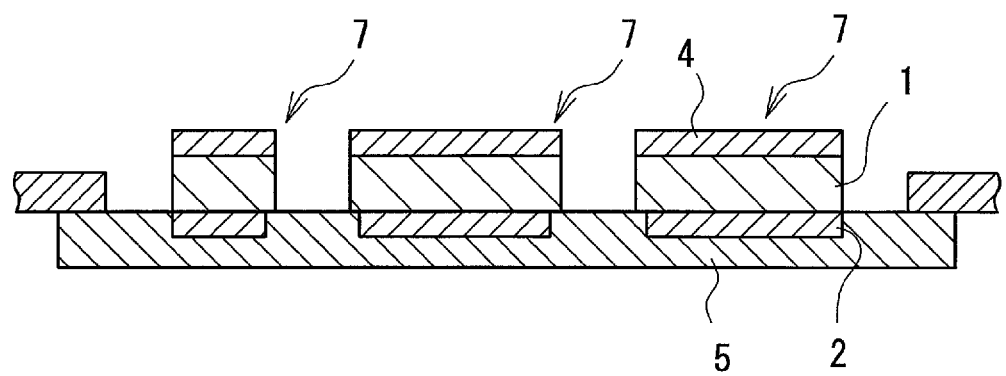
Figure 10C:
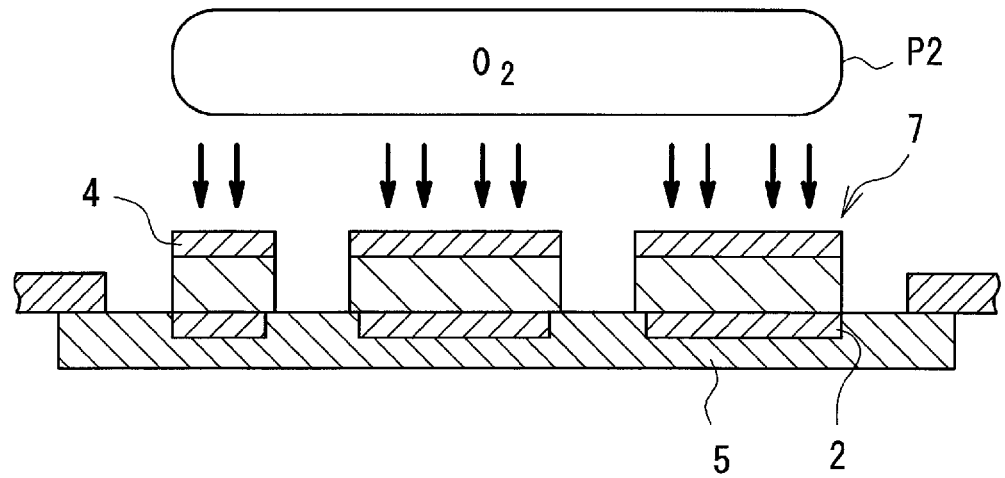

Then, after fixing the wafer-fixing tape 5 on the ring frame F, a treatment by plasma P1 of $SF_6$ gas is carried out from the backing face B side, thereby to etch the semiconductor wafer 1 (see FIG. 10(*a*)), so that the semiconductor wafer 1 is divided and singulated into an individual chip 7 (see FIG. 10(*b*)). After that, ashing is carried out by plasma P2 of $O_2$ gas (see FIG. 10(*c*)), thereby to remove the resist 4 remaining on the backing face B, so that the singulated chips 7 are obtained (see FIG. 11(*a*)). Then, the chip is knocked up with the pin M2 and is adsorbed and picked up with the collet M3 (see FIG. 11(*b*)), and then, the subsequent step(s) is transferred to a die-bonding step and so on.

In this embodiment, the wafer-fixing tape 5 covers the patterned face 2, thereby for protecting the patterned face 2 from the plasma-dicing step. For this reason, the wafer-fixing tape 5 has softness enough to cover the patterned face 2 sufficiently, and, on the other hand, in picking-up, does not leave any adhesive deposit on the patterned face 2 of the chip 7 the surface, and also has an easily peelable peeling-off property (detachability).

As for a second embodiment, modified examples are also preferred, in which the second embodiment is partially changed as described below.

Modified Example 2-1 [FIG. 12(*a*) to FIG. 12(*c*)]

This embodiment is different from the second embodiment in the aspect that, before the treatment by the plasma P1 of SF$_6$ gas in the second embodiment, a step of curing the temporary-adhesive layer 5b by exposing the wafer-fixing tape 5 to the radiation, such as an ultraviolet ray or the like, is contained. The other steps are the same as in the second embodiment.

Figure 12A:
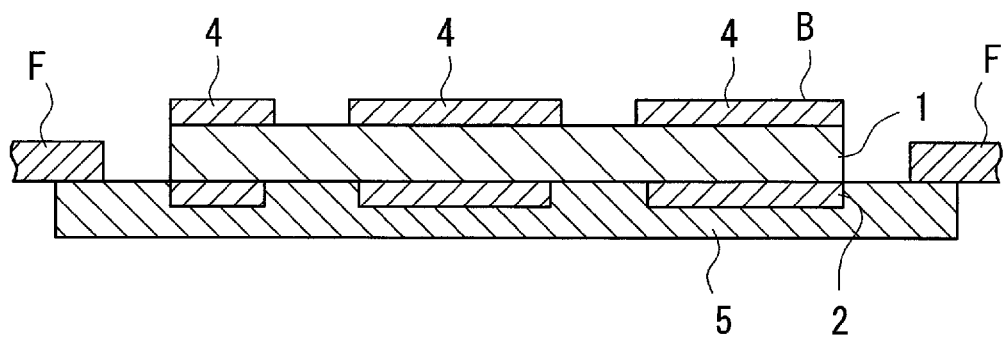
FIGS. 12(a) to 12(c) are schematic cross-sectional views illustrating steps before and after an ultraviolet ray irradiation in a modified example of the second embodiment of the present invention. Fragmentary
Figure 12B:
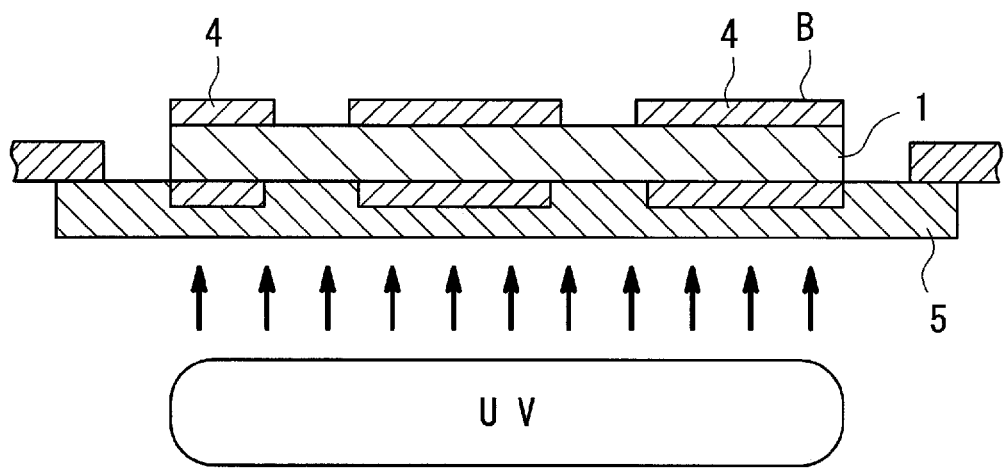
Figure 12C:
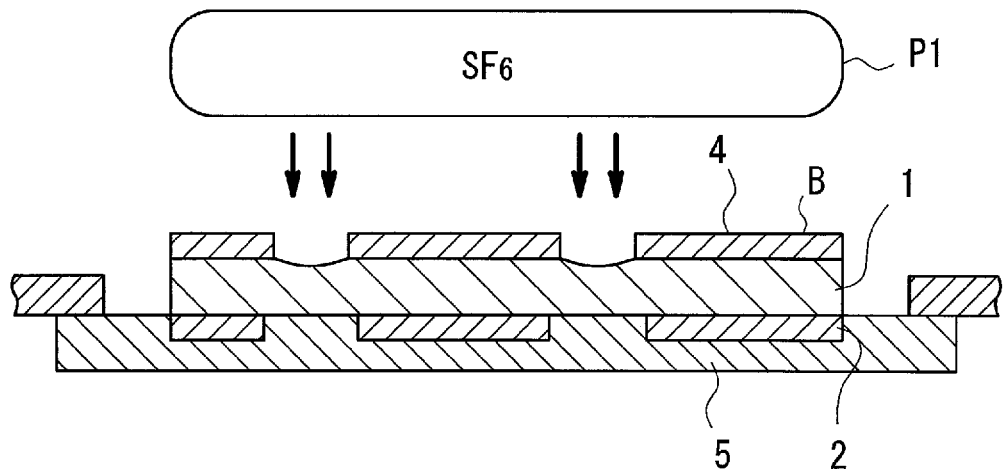

Specifically, the wafer-fixing tape 5 is laminated on the backing surface S side of the semiconductor wafer 1 on the backing face B side of which the resist 4 is formed (see FIG. 12(a)). After that, an ultraviolet ray is irradiated to the wafer-fixing tape 5 (see FIG. 12(b)), thereby to conduct crosslinking of the temporary-adhesive layer 5b. Then, a dicing treatment by the plasma P1 of SF$_6$ gas is carried out (see FIG. 12(c)).

In this embodiment, in the temporary-adhesive layer 5b of the wafer-fixing tape 5, the temporary-adhesive is 3-dimensionally crosslinked and solidified upon radiation of ultraviolet ray. Therefore, this embodiment is preferred in the aspect that heat resistance in the plasma dicing is enhanced.

The above embodiments are only examples of the present invention. Therefore, the present invention is not limited to any of these embodiments, and any of addition, deletion, or modification of the process known in each process may be carried out to the extent of being consistent with the spirit of the present invention.

EXAMPLES

The present invention will be described in more detail based on examples given below, but the invention is not meant to be limited by these.

Example 1

<Preparation of Wafer-Fixing Tape>

The wafer-fixing tapes shown in Table 1 were prepared as described below.

[Resin Composition Constituting the Temporary-Adhesive Layer]

As the resin composition which constitutes the temporary-adhesive layer, the following resin compositions A and B were used, respectively.

(Resin Composition A Constituting the Temporary-Adhesive Layer)

A radiation-curable temporary-adhesive resin composition A was prepared, by adding and mixing 4 mass parts of a polyisocyanate compound (trade name: CORONATE L, manufactured by Nippon Urethane Industry Co. Ltd.), 20 mass parts of tetramethylolmethane tetraacrylate as a compound having a photopolymerizable carbon-carbon double bond, 1 mass part of IRUGACURE 184 (trade name) manufactured by Ciba-Geigy Japan-Limited as a photopolymerization initiator, and 0.1 mass parts of dioctyl phtharate, to 100 mass parts of an acrylic-based polymer (a copolymer composed of: 2-ethylhexyl acrylate, methyl acrylate, and 2-hydroxyethyl acrylate, mass average molecular weight: 300,000, glass transition temperature: −35° C.).

(Resin Composition B Constituting the Temporary-Adhesive Layer)

0.2 mass parts of 2-methacryloyloxy ethylisocyanate (trade name: KARENZ MOI, manufactured by Showa Denko K.K.) as a compound having a photopolymerizable carbon-carbon double bond and a functional group was conducted to react with 100 mass parts of an acrylic copolymer composed of: butyl acrylate (79 mass %), methacrylic acid (1 mass %), and 2-hydroxyethyl acrylate (20 mass %), thereby to obtain a polymer in which a residual group having an acrylic monomer moiety having a group containing a radiation-curable carbon-carbon double bond has been bonded to a recurring unit of the main chain. The mass average molecular weight of this polymer was 600,000. Herein, the mass average molecular weight is a polystyrene-converted calculation value of the value obtained by measuring a 1% solution of the polymer dissolved in tetrahydrofuran, using a gel-permeation chromatography (trade name 150-C ALC/GPC, manufactured by Water Limited). A radiation-curable temporary-adhesive resin composition B was prepared, by adding and mixing 4 mass parts of a polyisocyanate compound (trade name: CORONATE L, manufactured by Nippon Urethane Industry Co. Ltd.), 1 mass part of IRUGACURE 184 (trade name) manufactured by Ciba-Geigy Japan-Limited as a photopolymerization initiator, and 0.08 mass parts of dioctyl phtharate, to 100 mass parts of the above polymer.

Substrate films having the respective thickness shown in Table 1 were prepared, by using, for a substrate film-constituting resin, an ionomer resin (ionomer-α) of ethylene/methacrylic acid/(2-methyl-propyl acrylate) terpolymer with an Mg metal ion as a metal ion <trade name HIMIRAN, manufactured by DuPont Mitsui Polychemicals Co., Ltd.>, followed by film-extrusion-molding the ionomer resin with a biaxial kneader. Then, the above-prepared temporary-adhesive resin composition was coated on a 25 μm polyethylene terephthalate (PET) separator so that the thickness after drying would be the amount shown in Table 1, followed by laminating on the substrate film, thereby to form an temporary-adhesive layer. Thus, wafer-fixing tapes 1 to 4 were produced, respectively.

Measurements of the arithmetic average roughness Ra on the surface of the substrate film, the thermal conductivity of the wafer-fixing tape, and the change of the adhesion force to silicon of the temporary-adhesive layer after heating at 100° C. for 10 minutes, were carried out as follows.

(Arithmetic Average Roughness Ra of the Substrate Film)

Measurement was carried using a surface roughness tester SV3000S4 (stylus method), manufactured by Mitutoyo Corporation.

(Thermal Conductivity of the Wafer-Fixing Tape)

The PET separator of the wafer-fixing tape was peeled off. After stacking 20 sheets of the wafer-fixing tape, the thus-stacked sample was cut into a test size, followed by measuring by a steady method thermal conductivity measuring equipment GH series, manufactured by Advance Riko Inc., in accordance with a temperature gradient method (steady method).

(Change of Adhesion Force to Silicon)

A specimen of the wafer-fixing tape cut into a 25 mm width was laminated on the Si mirror surface as an adherend, by using a 2 kg of lamination roller. After still standing for 1 hour, the specimen was irradiated to an ultraviolet ray, followed by subjecting to 90° peeling-off. Measurement was carried out at the peeling-off speed of 50 mm/min, and the measured value was defined as an adhesion force before heating. Similarly, after still standing for 1 hour, the specimen was heated on a hot plate of 100° C. for 10 minutes in the manner such that the backing face of the substrate film of the wafer-fixing tape would come into contact with the hot plate, followed by cooling for 15 minutes. After that, the specimen was irradiated to an ultraviolet ray, followed by subjecting to 90° peeling-off. Measurement was carried out at the peeling-off speed of 50 mm/min, and the measured value was defined as an adhesion force after heating. Note that, as measurement equipment, use was made of: a strograph tester, manufactured by Toyo Seiki Seisaku-sho, Ltd.

An absolute value of the difference, obtained by subtracting a adhesion force after heating from a adhesion force before heating, was defined as a change of the adhesion force, and was shown in Table 1.

These results were shown together in Table 1.

TABLE 1

|  |  | Wafer-fixing tape 1 | Wafer-fixing tape 2 | Wafer-fixing tape 3 | Wafer-fixing tape 4 |
|---|---|---|---|---|---|
| Substrate film | Resin | Ionomer α | Ionomer α | Ionomer α | Ionomer α |
|  | Thickness | 100 | 150 | 80 | 100 |
| Temporary-adhesive layer | Kind | A | A | A | B |
|  | Thickness | 10 | 10 | 10 | 10 |
| Surface roughness Ra (μm) |  | 2.8 | 2.5 | 2.8 | 2.8 |
| Thermal conductivity (W/m·K) |  | 0.3 | 0.32 | 0.28 | 0.35 |
| Change of adhesion force (N/25-mm) |  | 0.10 | 0.08 | 0.05 | 0.10 |

Further, as a wafer-fixing tape for comparison, the following wafer-fixing tapes were used.

[Wafer-Fixing Tape 5]

Wafer-fixing tape which is different only in the aspect that in the preparation of the wafer-fixing tape 1, the arithmetic average roughness Ra of the surface of the substrate film was changed to 3.5 μm by changing the unevenness of the molding roll.

[Wafer-Fixing Tape 6]

Wafer-fixing tape which is different only in the aspect that in the preparation of the wafer-fixing tape 1, the resin was changed to the following resin other than the ionomer resin.

Resin: a blend of PP (polypropylene)/elastomer

With respect to the wafer-fixing tape 5, the arithmetic average roughness Ra of the substrate film of the wafer-fixing tape 5 was 3.5 μm, the thermal conductivity of the wafer-fixing tape was 0.3 W/m·K, and a change of the adhesion force to silicon was 0.1 N/25-mm.

Further, with respect to the wafer-fixing tape 6, the arithmetic average roughness Ra of the substrate film of the wafer-fixing tape 6 was 2.0 μm, the thermal conductivity of the wafer-fixing tape was 0.3 W/m·K, and a change of the adhesion force to silicon was 0.05 N/25-mm.

<Processing of the Semiconductor Wafer>

The processing composed of the steps described below was carried out, using any of these wafer-fixing tapes.

At the beginning, a resist was coated on the patterned face side of the silicon wafer with a diameter of 8 inches, and a street portion was irradiated by photolithography, thereby to create an opening. Then, on its surface, a commercially available surface protective tape was laminated, and the silicon wafer was ground by a back grinder (DFD8540 (manufactured by DISCO Corporation)) until a thickness of the wafer would become 50 μm. Then, on the ground wafer backing face side, the wafer-fixing tape was laminated, followed by supporting and fixing by a ring frame. Then, the surface protective tape was peeled off.

After that, the wafer was subjected to plasma irradiation from the side on which the resist was coated, using $SF_6$ gas as a plasma occurring gas, at an etching speed of 0.5 μm/min, so that plasma dicing was carried out, and the wafer was cut and divided into individual chips. Then, ashing was carried out, using $O_2$ gas as a plasma occurring gas, at an etching speed of 1.0 μm/min, to remove the resist. After that, chips were picked up in the picking-up step.

In the case where the steps were carried out, using each of the wafer-fixing tapes 1 to 4 of the present invention, there was no occurrence of chipping in each case, and picking-up was able to perform favorably. In contrast, in the case where the steps were carried out, using each of the wafer-fixing tapes 5 and 6 for comparison, there was occurred chipping, and the picking-up was performed insufficiently.

From these results, it is found that the wafer-fixing tapes 1 to 4 of the present invention are excellent in both the heat resistance and the expansion property, when compared to the wafer-fixing tapes 5 and 6 for comparison.

Example 2

The processing composed of the steps described below was carried out, using each of the wafer-fixing tapes 1 to 6 prepared in Example 1.

At the beginning, a commercially available surface protective tape was laminated on the patterned face side of the silicon wafer with a diameter of 8 inches. The silicon wafer was ground by a back grinder (DFD8540 (manufactured by DISCO Corporation)) until a thickness of the wafer would reach 50 μm. Then, the resist was coated on the ground backing face side of the wafer, and the mask was formed by photolithography. Then, after peeling-off the surface protective tape, the wafer-fixing tape was laminated on the patterned face, followed by supporting and fixing by the ring frame. After fixing, an ultraviolet ray was irradiated from the wafer-fixing tape side, whereby the temporary-adhesive of the wafer-fixing tape was conducted to crosslink.

After that, the wafer was subjected to plasma irradiation from the side on which the resist was coated, using $SF_6$ gas as a plasma occurring gas, at an etching speed of 0.5 μm/min, so that plasma dicing was carried out, and the wafer was cut and divided into individual chips. Then, ashing was carried out, using $O_2$ gas as a plasma occurring gas, at an etching speed of 1.0 μm/min, to remove the resist. After that, chips were picked up in the picking-up step.

In the case where the steps were carried out, using each of the wafer-fixing tapes 1 to 4 of the present invention, there was no occurrence of chipping in each case, and picking-up was able to perform favorably. In contrast, in the case where the steps were carried out, using each of the wafer-fixing tapes 5 and 6 for comparison, there was occurred chipping, and the picking-up was performed insufficiently.

Example 3

Figure 7B:
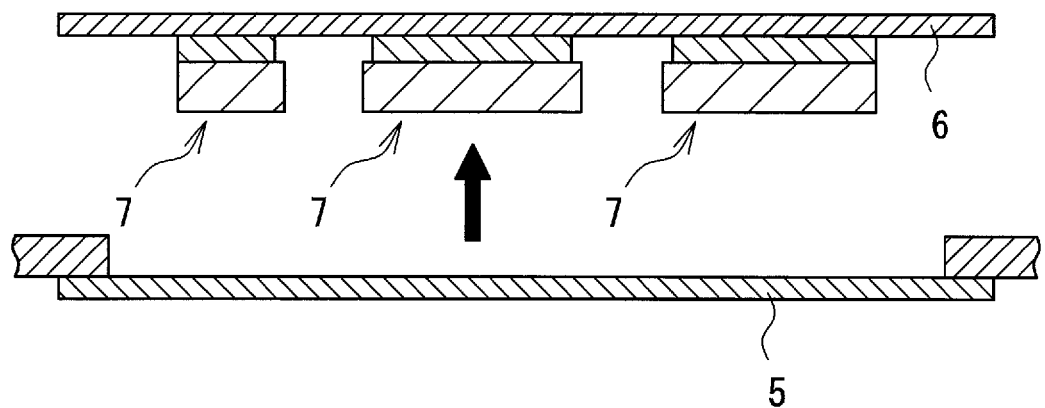
Figure 7C:
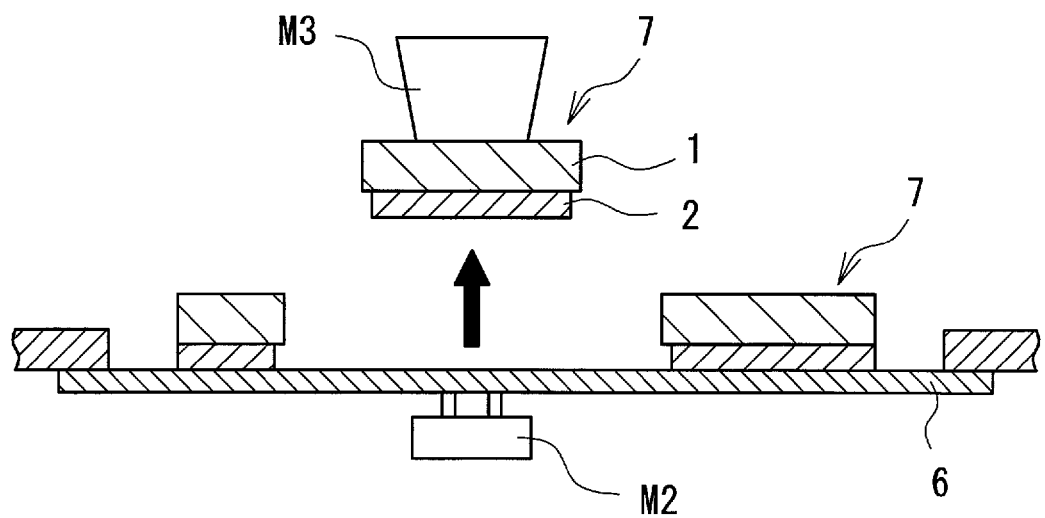

In Example 3, the steps were carried out in the same manner as in Example 1, except that each chip resulting from dicing on the wafer-fixing tape was transferred to the picking-up tape 6, as shown in FIG. 7(b); and then, the chip was knocked up with the pin from the picking-up tape, and was picked up with the collet, as shown in FIG. 7(c).

In the case where the steps were carried out, using each of the wafer-fixing tapes 1 to 4 of the present invention, there was no occurrence of chipping in each case, and picking-up was able to perform favorably. In contrast, in the case where the steps were carried out, using each of the wafer-fixing tapes 5 and 6 for comparison, there was occurred chipping, and the picking-up was performed insufficiently.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2015-051481 filed in Japan on Mar. 13, 2015, which is entirely herein incorporated by reference.

REFERENCE SIGNS LIST 1 semiconductor wafer
2 patterned face
3 surface protective tape
4 resist
5 wafer-fixing tape
5a substrate film
5b temporary-adhesive layer
6 picking-up tape
7 chip
S surface
B backing face
M1 wafer-grinding apparatus
M2 pin
M3 collet
F ring frame
L $CO_2$ laser
P1 plasma of $SF_6$ gas
P2 plasma of $O_2$ gas

The invention claimed is:

1. A wafer-fixing tape, comprising:
a temporary-adhesive layer provided on a substrate film,
wherein the substrate film contains an ionomer resin comprising a terpolymer crosslinked by a metal ion,
wherein the thermal conductivity of the wafer-fixing tape is from 0.2 W/m·K to 5.0 W/m·K, and
wherein an arithmetic average roughness Ra of a surface of the substrate film opposite to the temporary-adhesive layer is from 0.1 to 3.0 μm, and
wherein the metal ion is Mg ion.

* * * * *